United States Patent [19]
Hasbun et al.

[11] Patent Number: 5,875,477
[45] Date of Patent: Feb. 23, 1999

[54] METHOD AND APPARATUS FOR ERROR MANAGEMENT IN A SOLID STATE DISK DRIVE USING PRIMARY AND SECONDARY LOGICAL SECTOR NUMBERS

[75] Inventors: Robert N. Hasbun, Shingle Springs; Daniel H. Leemann, Folsom, both of Calif.

[73] Assignee: Intel Corporation, Santa Clara, Calif.

[21] Appl. No.: 577,742

[22] Filed: Dec. 22, 1995

[51] Int. Cl.$^6$ .............................. G06F 12/16; G06F 11/08
[52] U.S. Cl. ...................... 711/162; 711/103; 395/182.04
[58] Field of Search ..................... 711/103, 161, 711/162, 5; 395/182.03, 182.04, 182.05, 183.18

[56] References Cited

U.S. PATENT DOCUMENTS

| | | | |
|---|---|---|---|
| 5,070,474 | 12/1991 | Tuma et al. ............................... | 395/500 |
| 5,131,089 | 7/1992 | Cole ......................................... | 395/500 |
| 5,200,959 | 4/1993 | Gross et al. ............................ | 371/21.6 |
| 5,394,362 | 2/1995 | Banks . | |
| 5,479,633 | 12/1995 | Wells et al. ............................. | 711/103 |
| 5,535,369 | 7/1996 | Wells et al. . | |
| 5,581,723 | 12/1996 | Hasbun et al. ........................... | 711/103 |
| 5,586,285 | 12/1996 | Hasbun et al. ........................... | 711/103 |
| 5,603,001 | 2/1997 | Sukegawa et al. ...................... | 711/103 |
| 5,640,529 | 6/1997 | Hasbun .................................... | 711/103 |
| 5,737,742 | 4/1998 | Achiwa et al. .......................... | 711/103 |

*Primary Examiner*—Glenn Gossage
*Attorney, Agent, or Firm*—Blakely, Sokoloff, Taylor & Zafman LLP

[57] ABSTRACT

A method of accessing a memory includes the step of partitioning the memory into a plurality of partitions. A primary logical identifier is stored in the memory to identify each partition. A redundant secondary logical identifier is also stored in the memory to identify each partition. In response to a requested partition number identifying a partition to access, at least one partition of data is located using a first stored logical identifier formed from a portion of each of the primary and secondary logical identifiers. The at least one partition of data is then identified using a second stored logical identifier formed from a portion of at least one of the primary and secondary logical identifiers. In one embodiment, a first error detection code (EDC) stored in the header is used to validate the partition data. If an error is detected, the validity of the partition data is tested using an EDC computed by ANDing the first EDC and a second EDC stored in the header. During a clean-up operation, a header is selected from a block targeted for clean-up. The first and second stored logical identifiers in the selected header are compared with each other. If there is not a match, then validation is performed using the ANDed value of the first and second stored logical sector number. In one embodiment, the memory is a flash electrically erasable programmable read only memory. In one embodiment, the partitions are sectors and the identifiers are sector numbers.

41 Claims, 15 Drawing Sheets

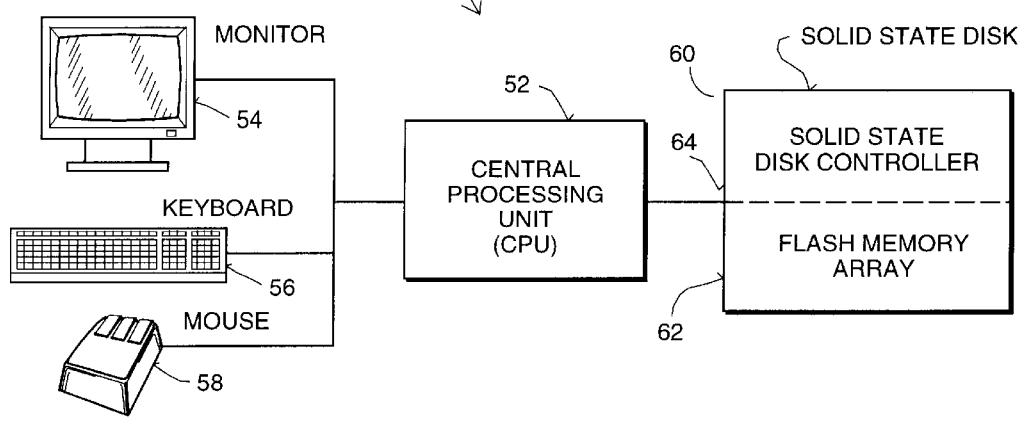
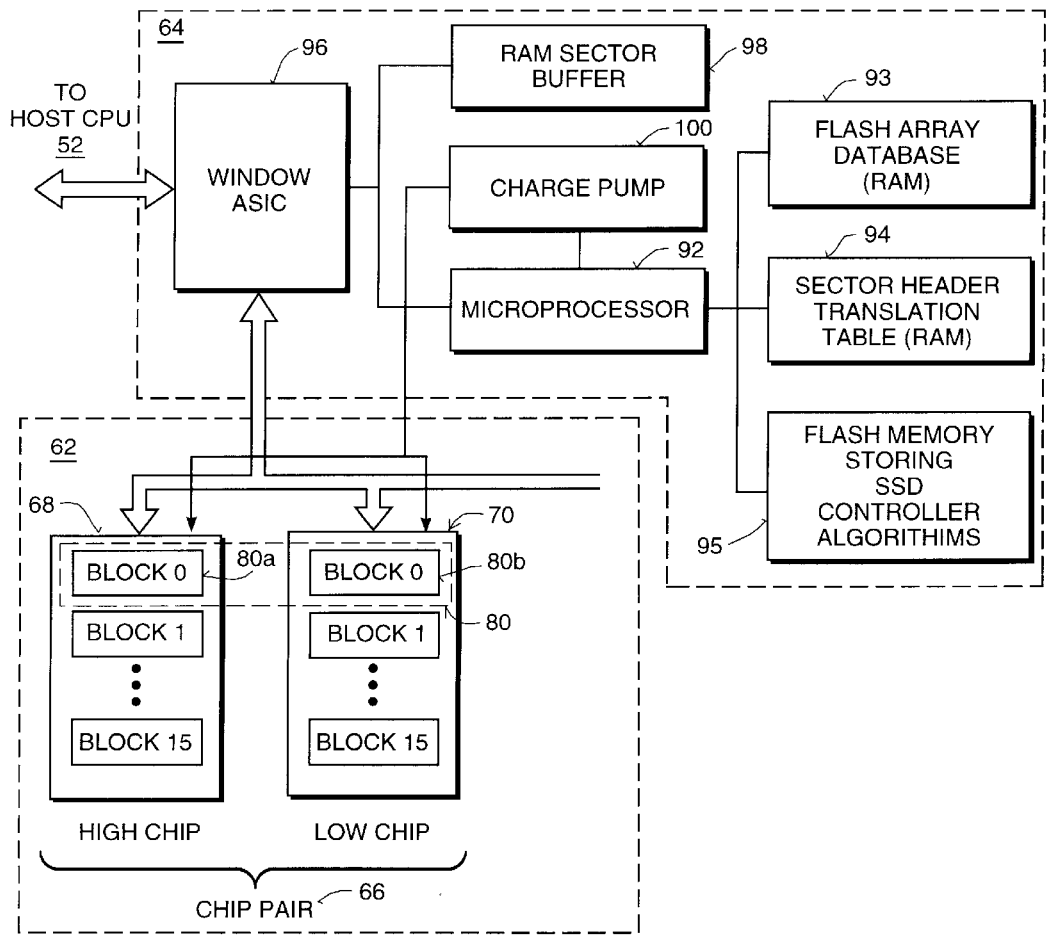

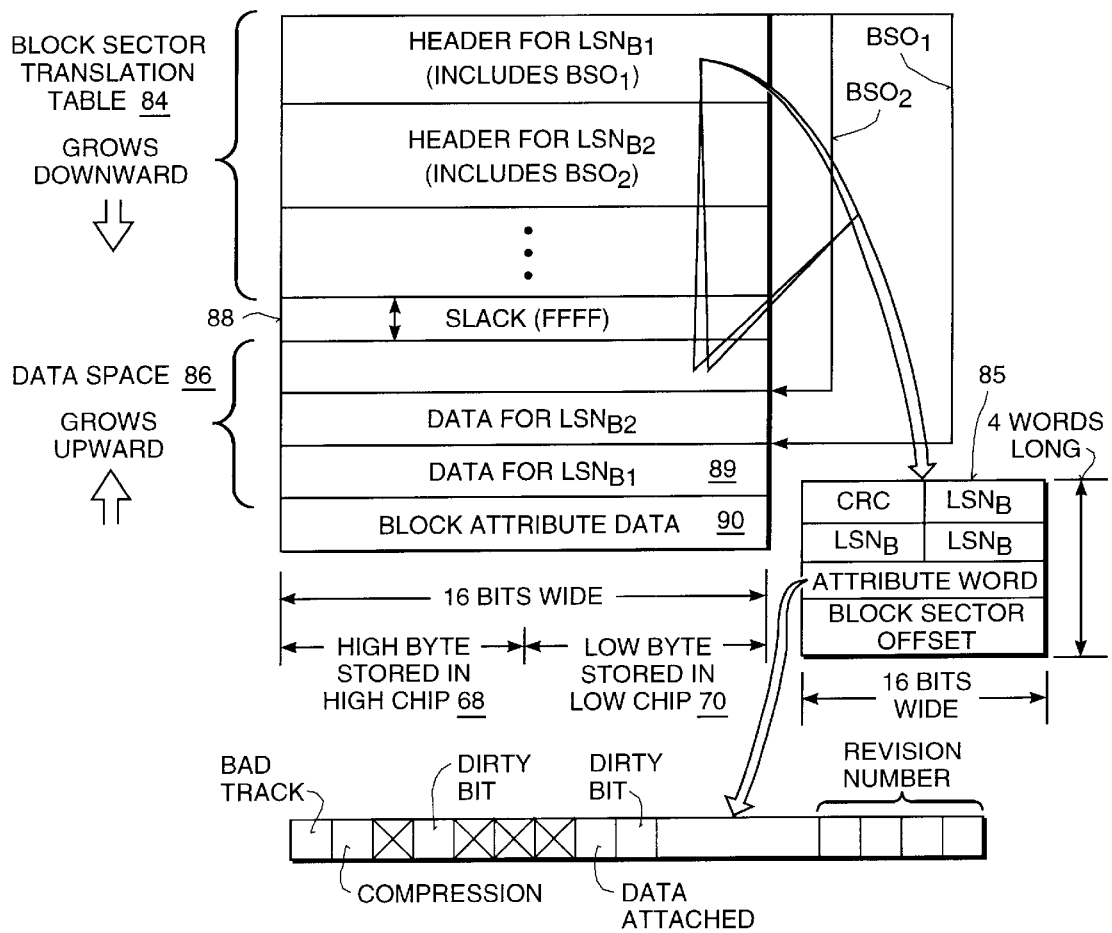
FIG_3
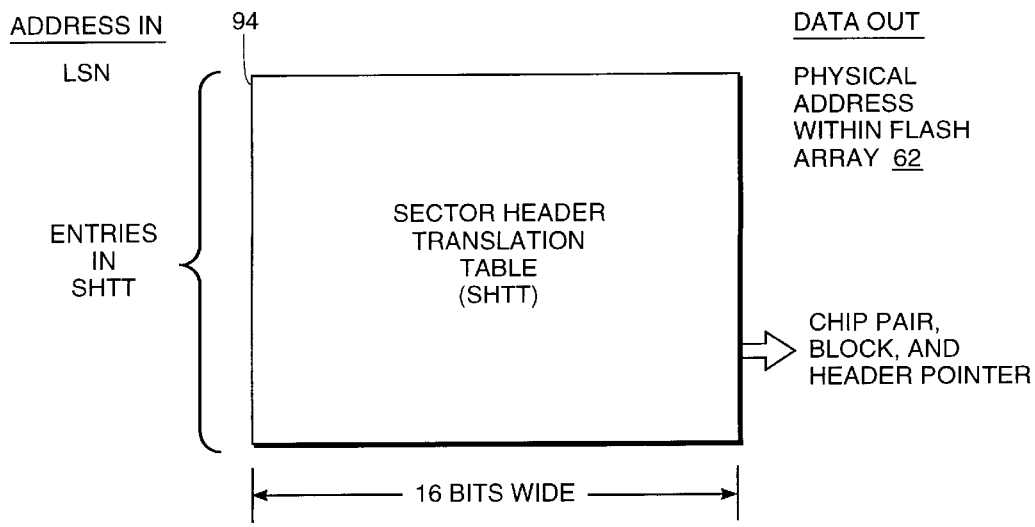
FIG_4

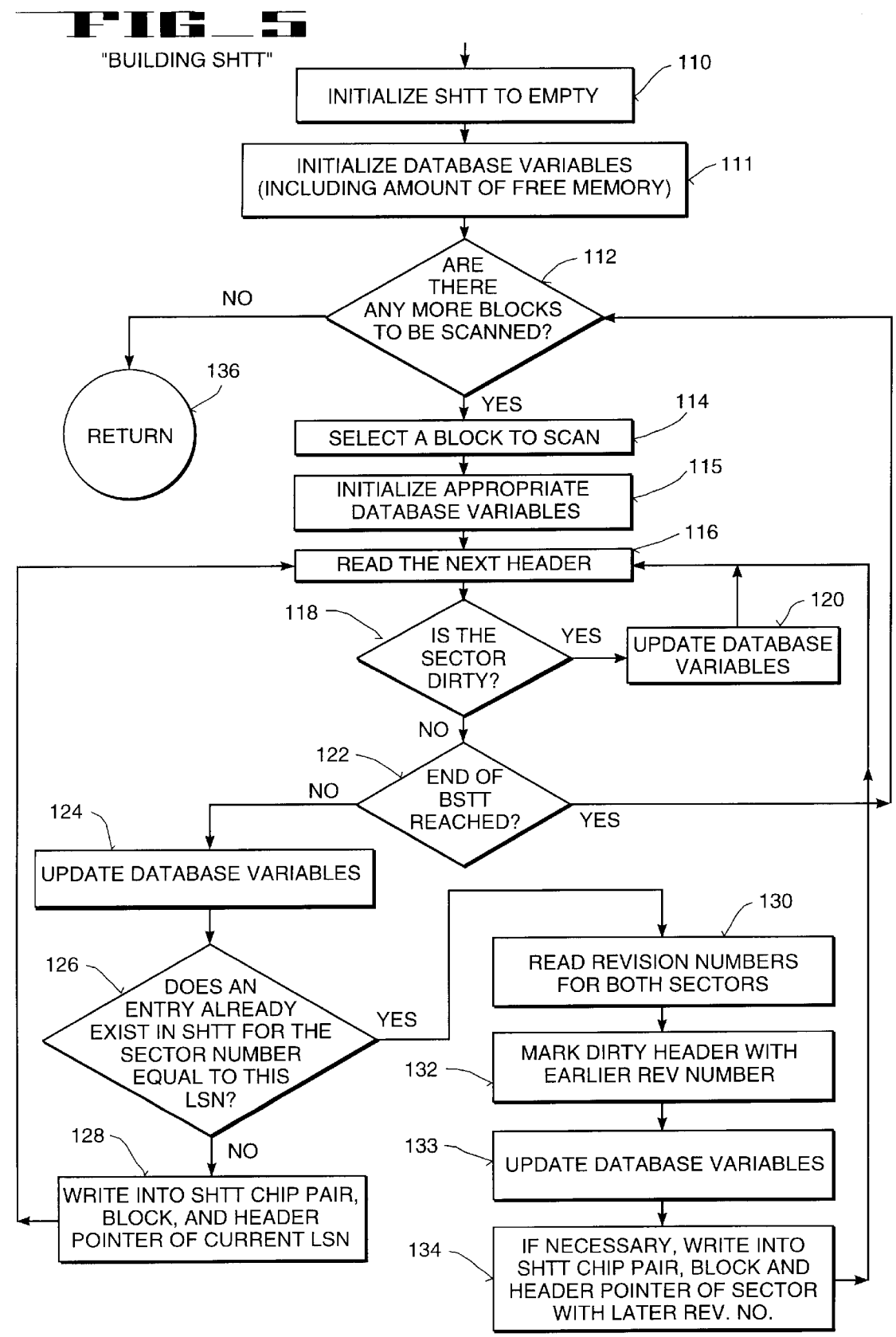

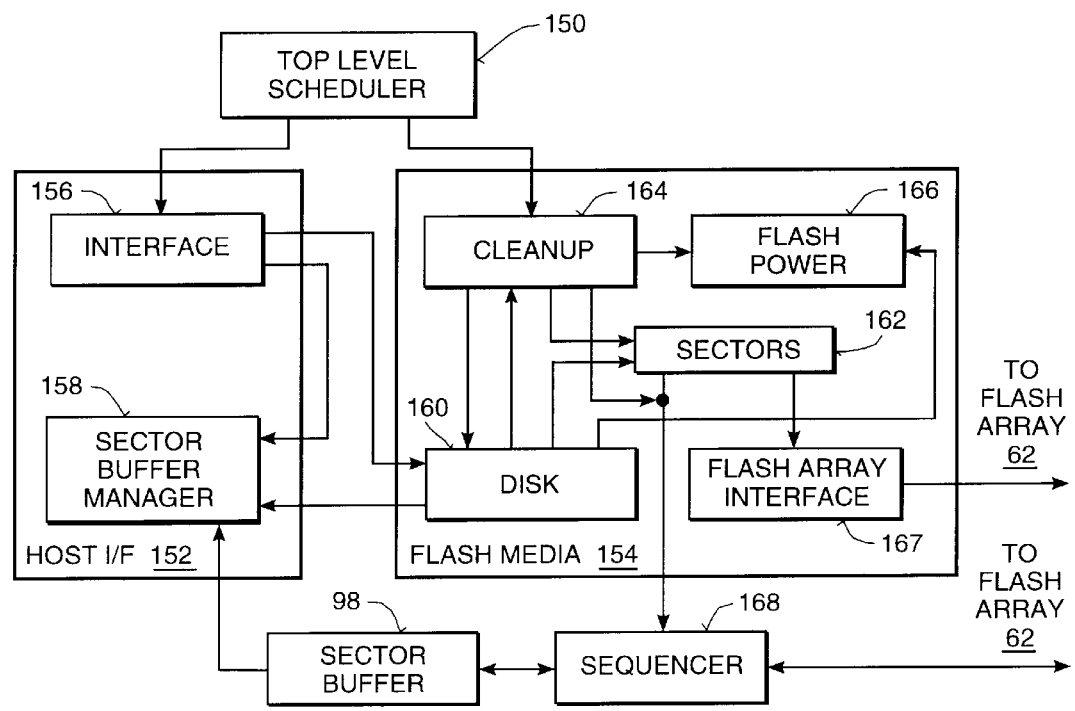
FIG_6

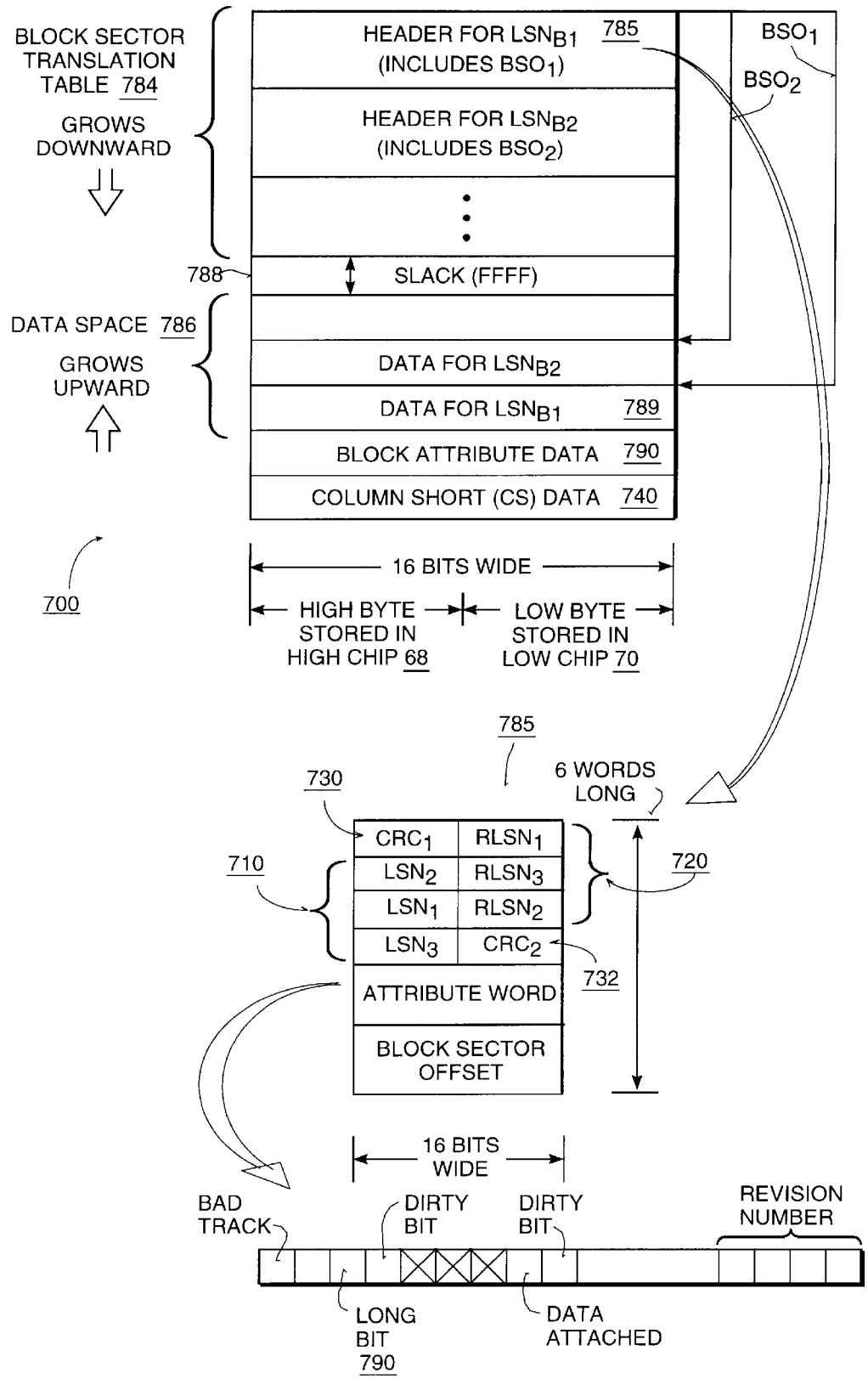

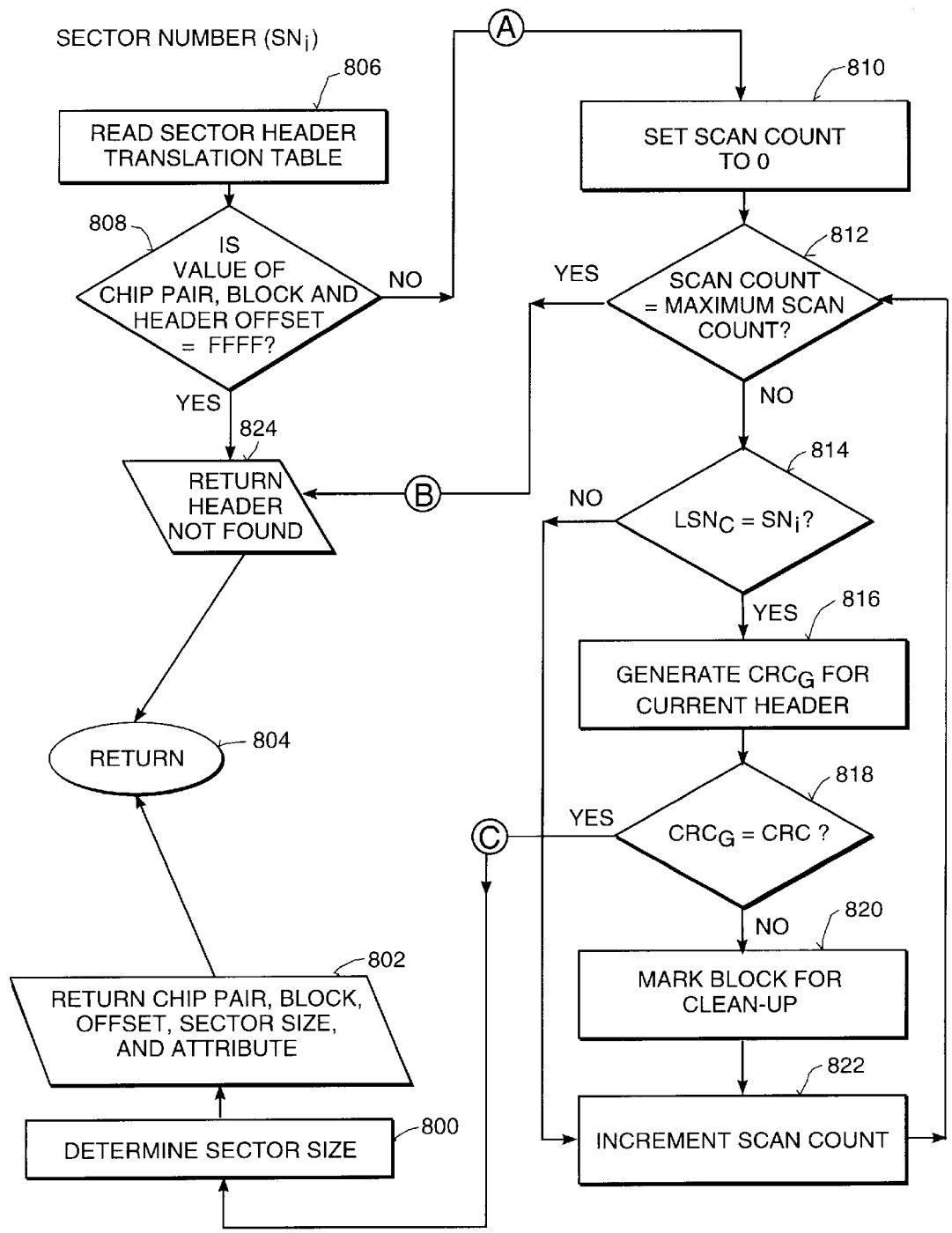

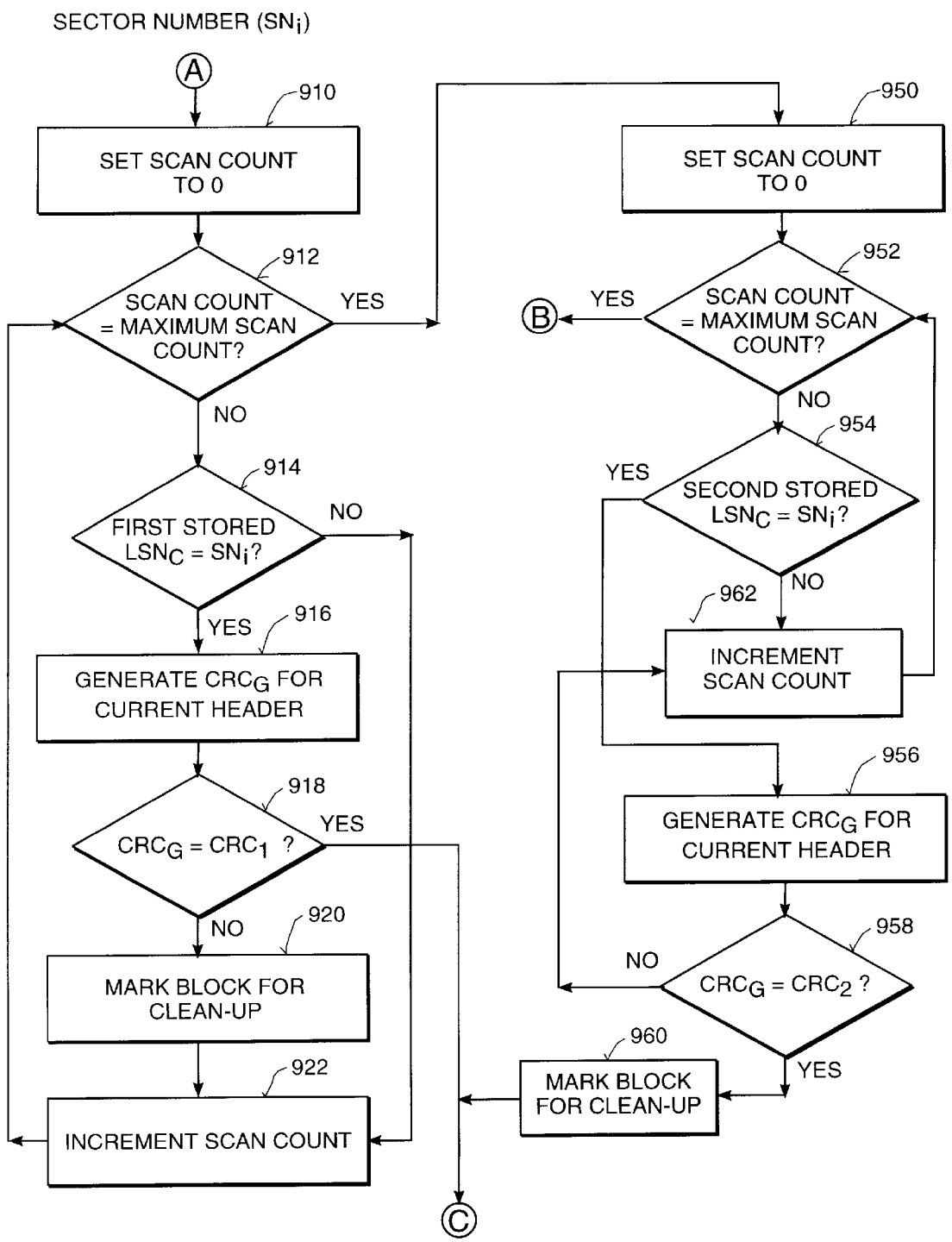

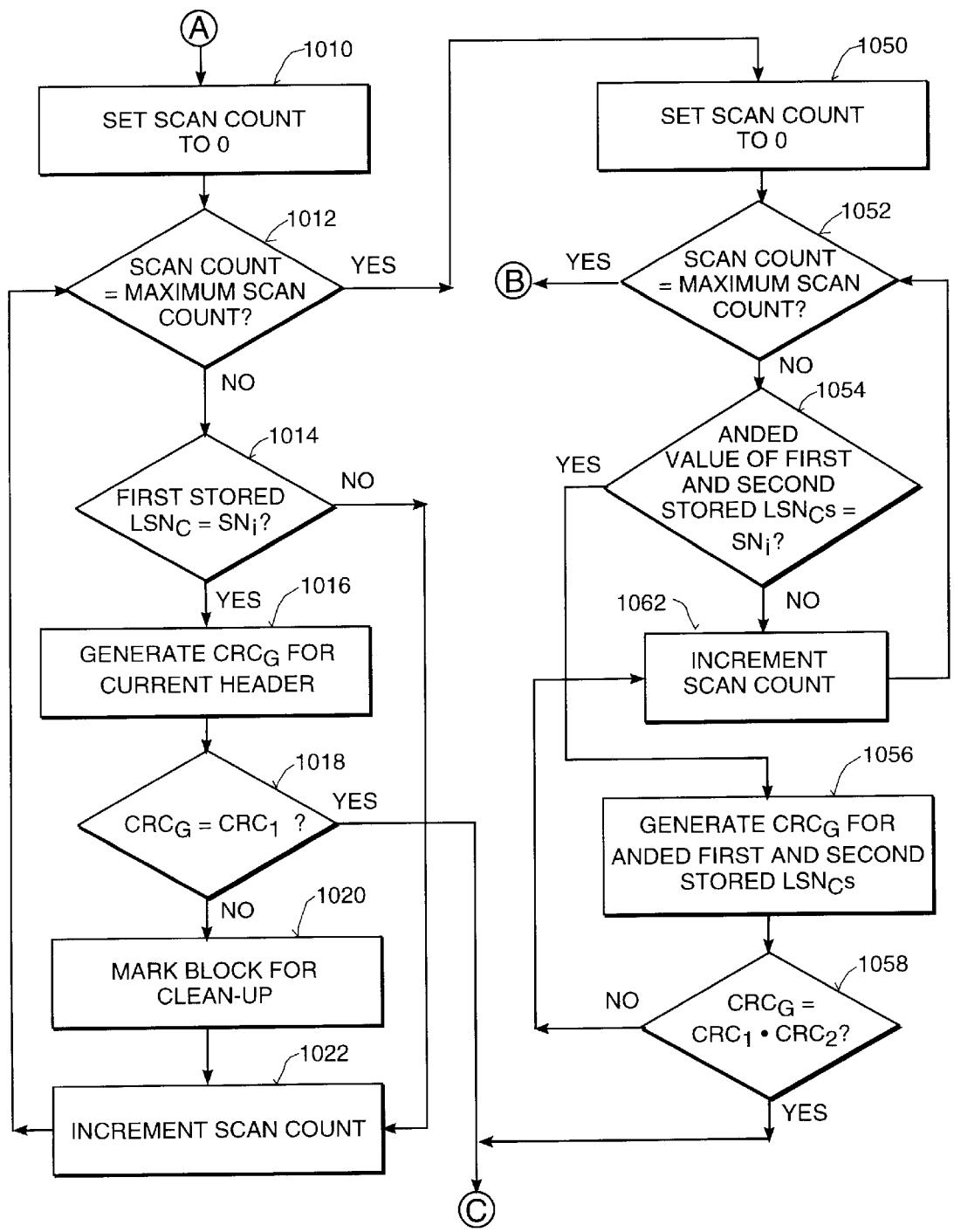

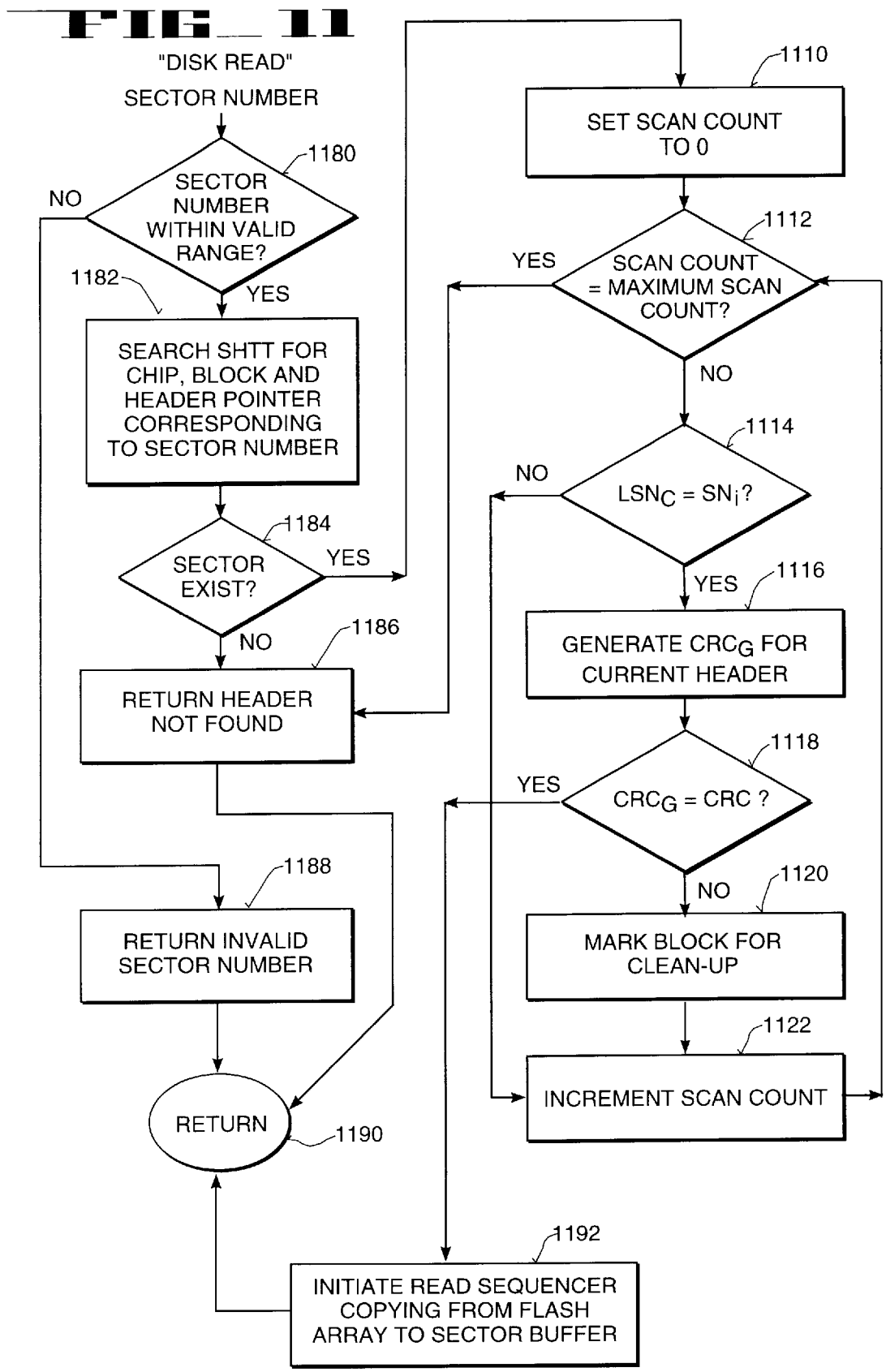
FIG_11

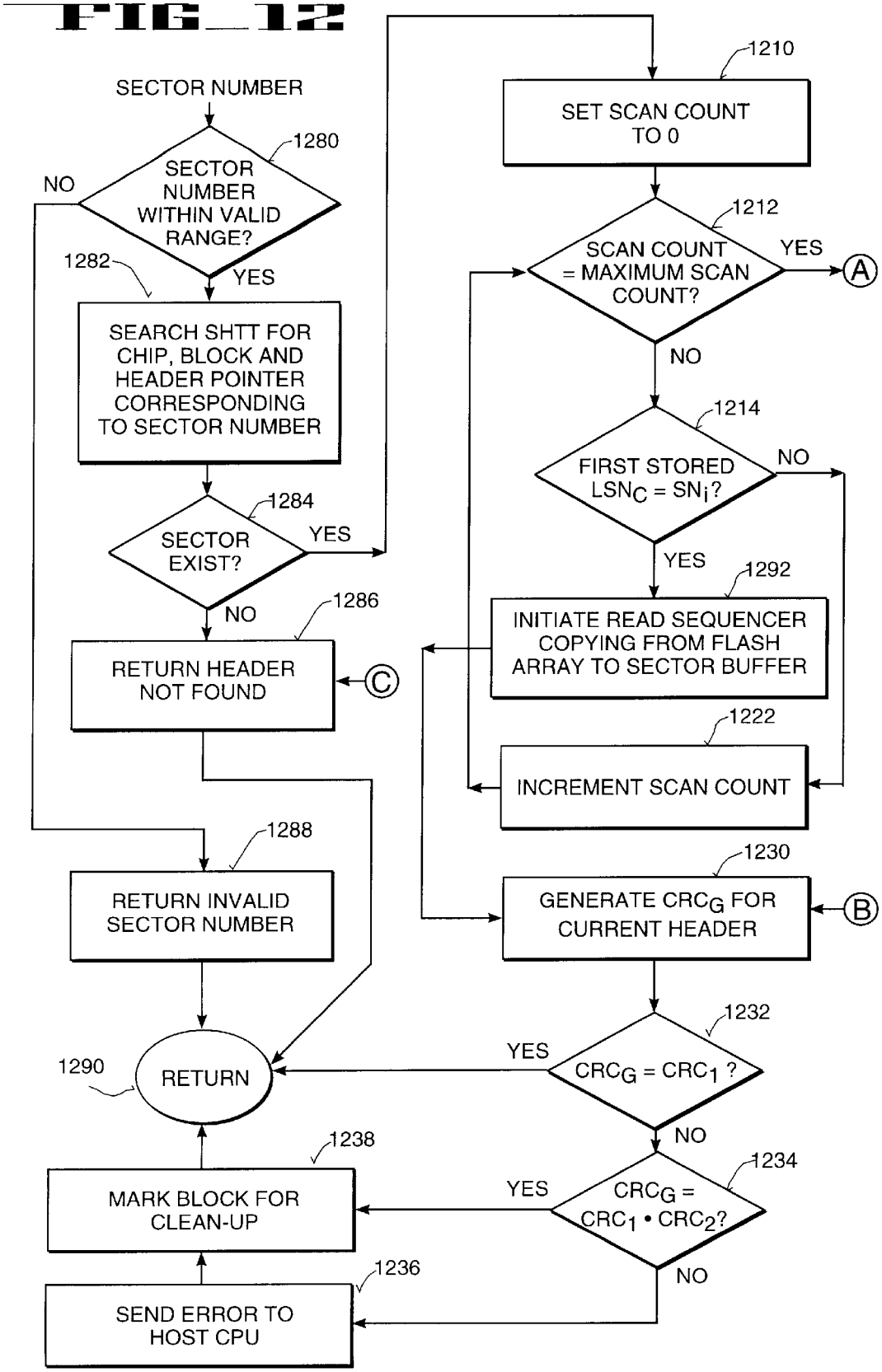
FIG_12

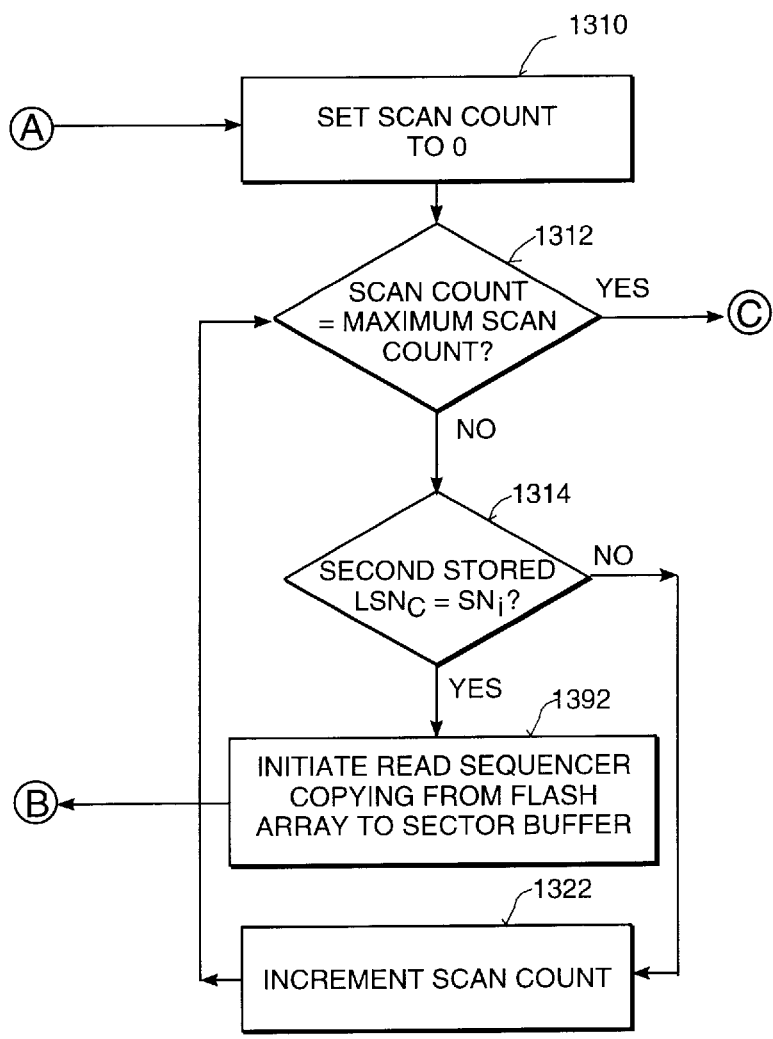
FIG_13

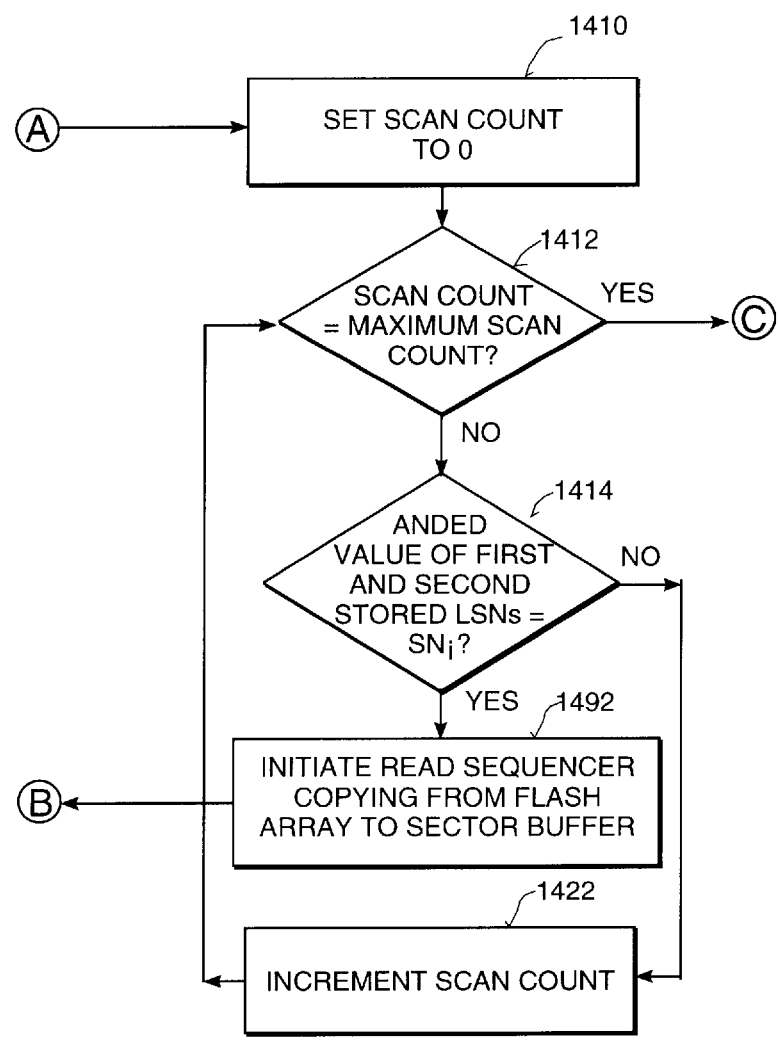
FIG_14

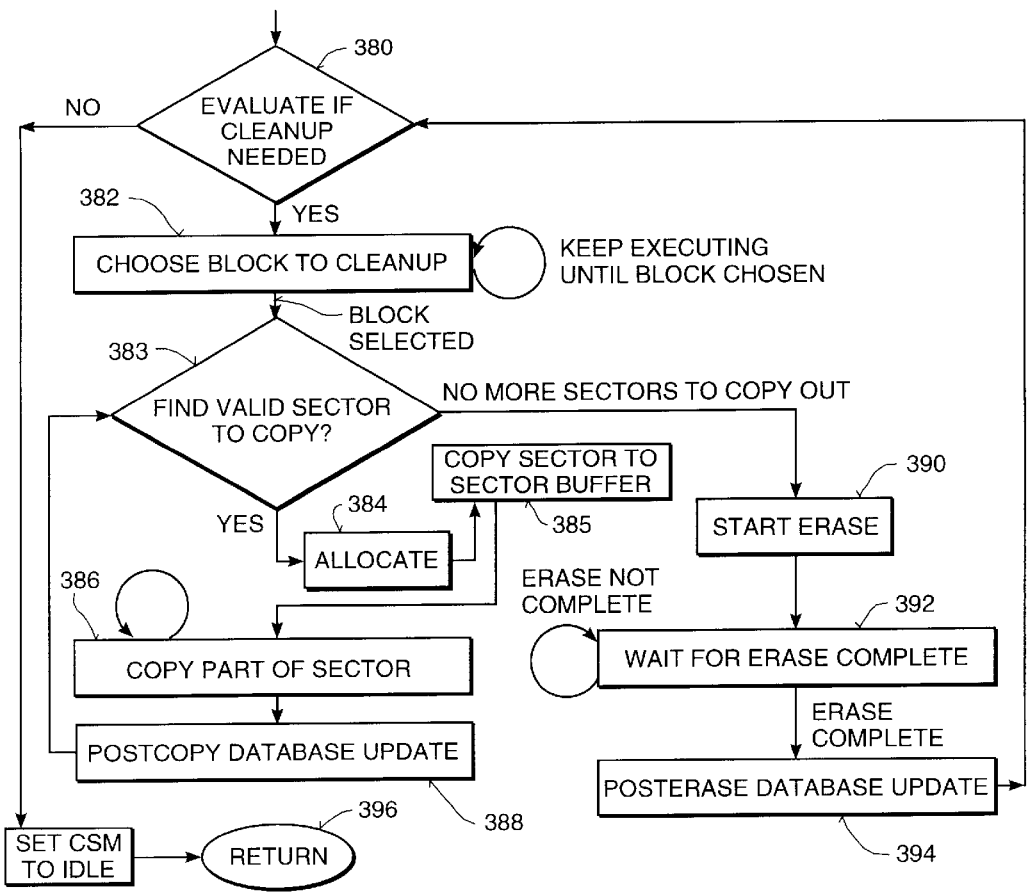
FIG_15 "STATES OF BACKGROUND CLEAN-UP STATE MACHINE"

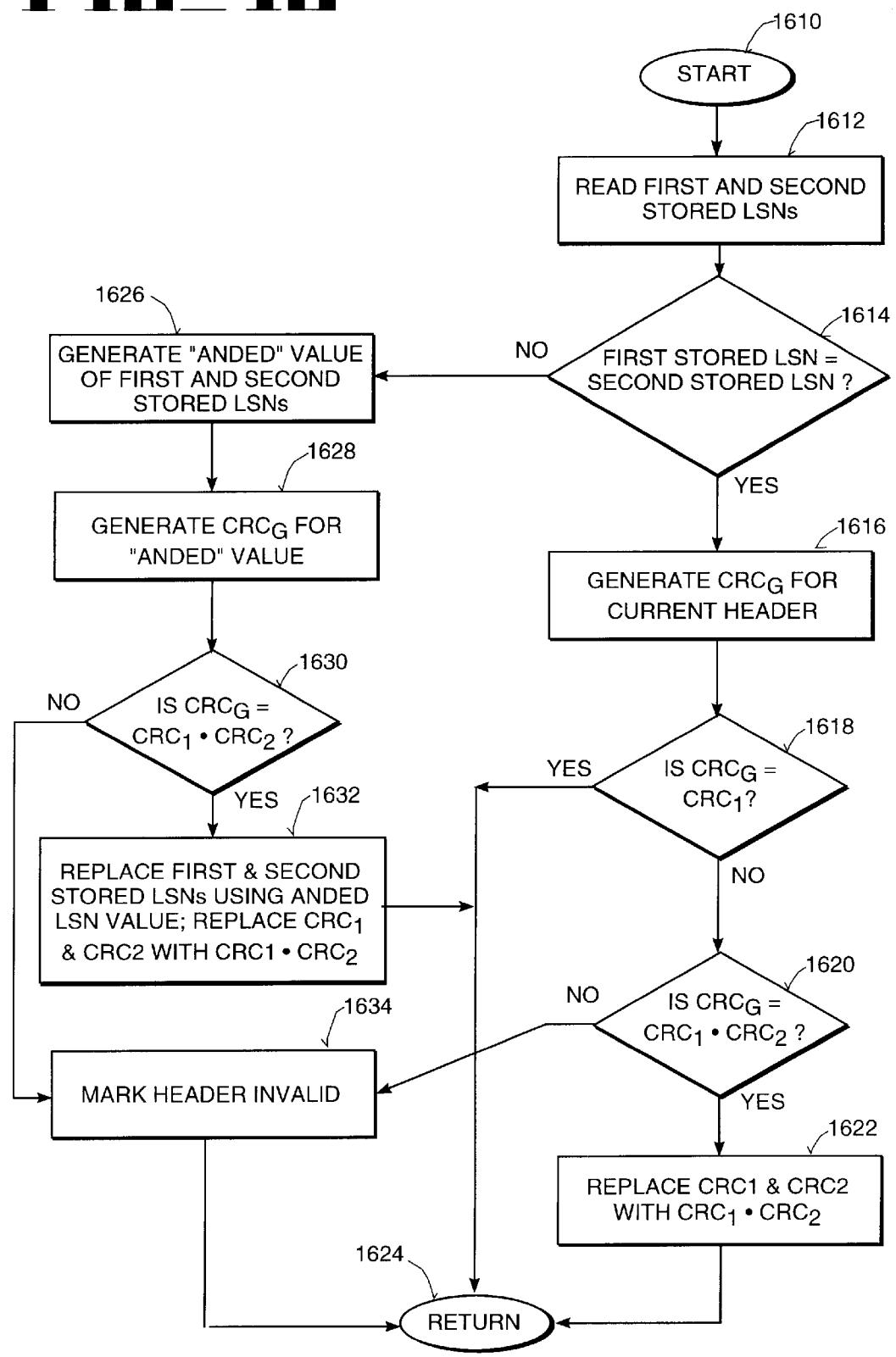

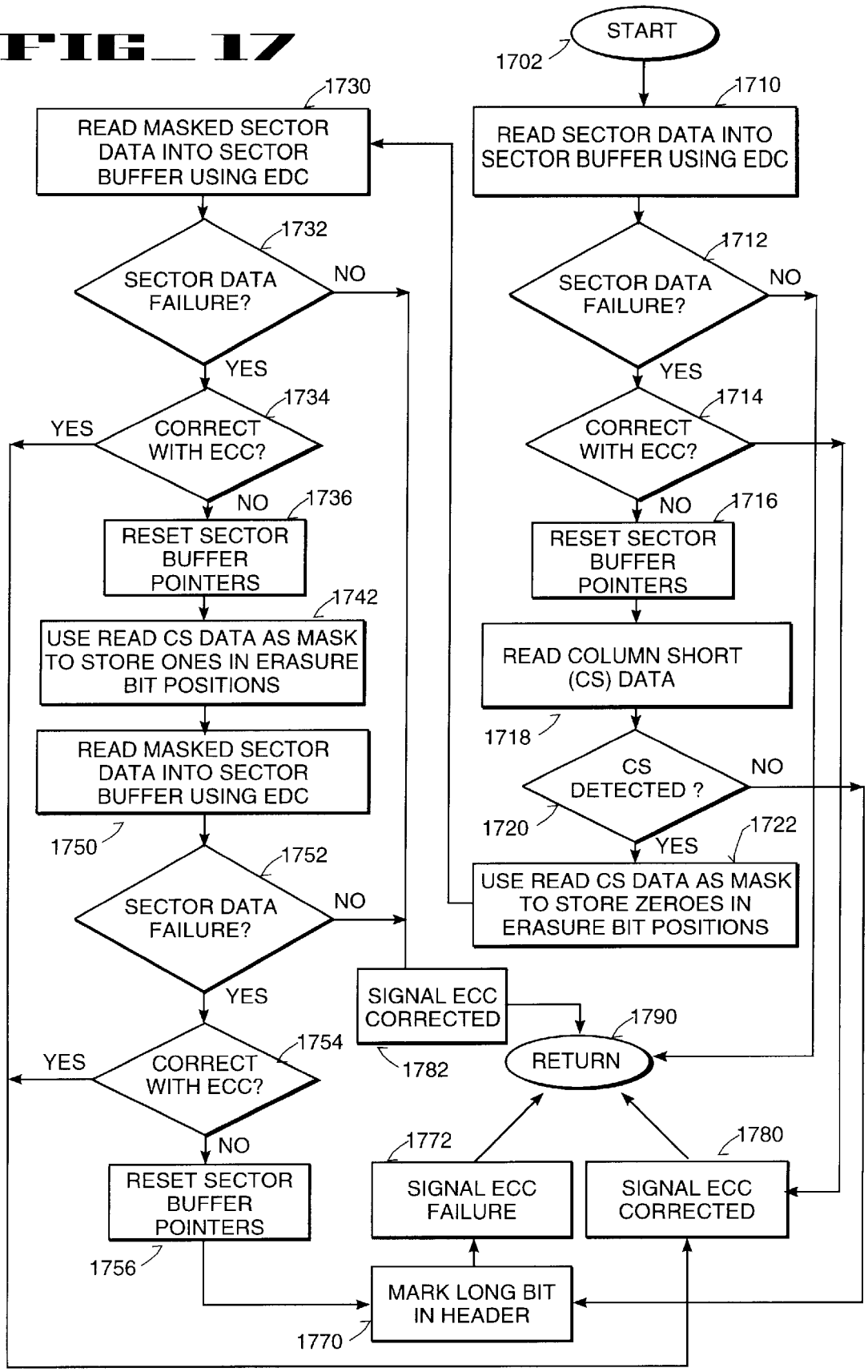

METHOD AND APPARATUS FOR ERROR MANAGEMENT IN A SOLID STATE DISK DRIVE USING PRIMARY AND SECONDARY LOGICAL SECTOR NUMBERS

FIELD OF THE INVENTION

The present invention pertains to the field of computer storage systems. More particularly, the present invention pertains to a method for error management in a solid state disk drive using primary and secondary logical sector numbers.

BACKGROUND OF THE INVENTION

The nonvolatility of magnetic disk drives ("hard" drives) is one of the primary reasons for their use as mass storage devices in computer systems. They may be turned on and off without loss of data. Hard drives include one or more circular platters. Data is stored on concentric tracks of magnetic media on the platters. Each track is further divided into sectors. A sector of data is typically 512 bytes in size.

A hard drive controller typically receives sector numbers from a host processor (e.g., central processing unit or CPU). These sector numbers are then translated to a physical location for accessing the hard drive to obtain a sector of data. A given sector number generally always corresponds to the same physical location on the hard drive. In other words a unique one-to-one mapping exists between sector numbers and physical locations within the hard drive.

A typical user file stored on a hard drive occupies many sectors distributed within the disk drive. These sectors can be distributed across multiple tracks and platters. In addition, the sectors used by the user file may not be contiguous sectors within a track.

Hard drives suffer from a number of disadvantages including sensitivity to vibration, dust, humidity, and sudden changes in velocity. Hard drives also consume relatively large amounts of power, which makes them less attractive for computers that are battery powered.

Solid state disks provide an alternative to magnetic hard disk drives. Solid state disks (also "solid state drives") use semiconductor memories, also referred to as solid state memories, as a storage medium. Semiconductor memories are comparatively more rugged than hard drives and offer the advantage of being much less sensitive to vibration, dust, humidity, and sudden changes in velocity. Semiconductor memories also tend to require less power than a typical hard drive with similar storage capacity.

One type of nonvolatile semiconductor memory is the flash electrically erasable programmable read only memory ("flash EEPROM" or simply "flash memory"). Flash memories can be programmed by the user and once programmed retain their data until erased. Flash memories are erased by erasing a block of memory at a time. Erasing a flash memory tends to require considerably more time than reading or programming operations.

Some prior art solid state disks use flash memory. Unlike the hard drive, a sector number provided by the host CPU may not correspond to the same physical address for accessing a location within the solid state drive due to the limitations in erasing and programming a flash memory device. In one embodiment, sectors of data are written to available locations instead of a unique location within the flash memory in order to defer an erase operation. Thus the sector number becomes a "logical" sector number as opposed to a physical sector number identified with a unique address. This technique requires version control and additional overhead including translation and index tables for locating the physical address within the flash memory that corresponds to a logical sector number. Without the translation and index tables the data may not be retrievable even though it is still stored in the nonvolatile memory.

Although the solid state memories are relatively immune to environmental factors that negatively affect hard drives, solid state memories have their own shortcomings. Unlike a magnetic hard drive, semiconductor memories such as flash memory suffer charge loss over time. The charge on the floating gate of a flash cell may dissipate due to, for example, leakage. This charge loss may cause a change in the interpreted state of the flash cell which in turn results in data loss. Typically charge loss is not due to a permanent defect and although the data is lost, the cell is not permanently damaged and can be used for future storage. Thus the charge loss problem can be termed a temporary defect.

Another disadvantage of semiconductor memories is failure due to column shorts. Memory arrays are arranged in rows and columns. Typically the rows are associated with "words" of memory and the columns correspond to bitlines (or "bit lines") which represent "bits". If one or more bitlines are electrically shorted together, possibly during the manufacturing process, the result is a column short. A column short permanently affects all shorted bitlines and can essentially render useless the sensing of every bit associated with a shorted bitline for every word in at least one block of the array.

One disadvantage of using logical sector numbers is that if the overhead data such as the translation or index tables become corrupted such as from charge loss or column shorts, the data may not be retrievable because it cannot be located.

Thus improving the error management for both column shorts and charge loss within a solid state disk drive is desirable.

SUMMARY OF THE INVENTION

One object of the present invention is to improve the correctability of memory errors due to charge loss.

A primary logical identifier is used to locate at least one partition of data stored in the memory after receiving a requested partition number identifying a requested partition. The secondary logical identifier is used to compute a value to further identify the at least one partition of data. The value is computed by performing a logical AND operation between the primary logical identifier and the secondary logical identifier. This value is compared with the requested partition number.

Another object is to locate memory errors due to column shorts. A method of detecting and locating bit errors due to a column short in a memory is described. First a stripe of data is written to the memory, each bit of the written stripe having a known value. The written stripe of data is compared to a read stripe of data. The bit errors are located by locating a position of each inverted known value in the read stripe of data.

Another object is to improve the correctability of memory errors due to a column short using the location of the bits affected by the column short. A method of correcting column short errors for partition data read from a memory is described. A mask is generated to locate one or more bit positions within a word of memory affected by shorted columns. Every word of the partition data is masked to store a first value in the bit positions affected by shorted columns.

The masked partition data is validated. If the validation fails, every word of the partition data is masked to store a second value in the bit positions affected by shorted columns.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which:

FIG. 1 illustrates some of the system components of a personal computer including a solid state disk.

FIG. 2 is a block diagram of a solid state disk.

FIG. 3 illustrates a block data structure for a block in the flash memory array.

FIG. 4 illustrates one embodiment of a sector header translation table.

FIG. 5 is a flowchart of an algorithm for building a sector header translation table upon power-up.

FIG. 6 is an object diagram of the algorithms of the solid state disk controller.

FIG. 7 illustrates an improvement to the block data structure for a block in the flash memory array.

FIG. 8 is a flowchart for one embodiment of a disk seek operation.

FIG. 9 is a flowchart for an embodiment of a disk seek operation using RLSNs.

FIG. 10 is a flowchart for an alternative embodiment of the disk seek operation of FIG. 9 using RLSNs.

FIG. 11 illustrates a flowchart for a disk read operation.

FIG. 12 illustrates a flowchart for a disk read operation having validation performed while data is being read from the solid state disk to the host CPU.

FIG. 13 illustrates a flowchart for an extended sector search for the disk read operation of FIG. 12.

FIG. 14 illustrates an alternative embodiment of the extended sector search of FIG. 13.

FIG. 15 illustrates a flowchart for one embodiment of a background clean-up operation.

FIG. 16 illustrates a flowchart for verification during the clean-up operation using first and second stored logical sector numbers.

FIG. 17 illustrates a flowchart for correcting sector data in the event of a column short.

DETAILED DESCRIPTION

Overview of a Solid State Disk

FIG. 1 illustrates some of the system components of a personal computer 50. Personal computer 50 includes central processing unit (CPU) 52 and monitor 54 for visually displaying information to a computer user. Keyboard 56 allows the computer user to input data to CPU 52. By moving mouse 58 the computer user moves a pointer displayed on monitor 54. Personal computer 50 uses solid state disk 60 for mass storage rather than a hard drive. Solid state disk 60 includes solid state disk controller 64 to control nonvolatile semiconductor memory array 62. In this embodiment, nonvolatile semiconductor memory array 62 is also referred to as flash memory array 62.

Unlike a hard drive, sector data associated with a sector number is not stored at a fixed physical location within solid state disk 60. In other words, a sector number does not always correspond to the same physical location within flash array 62. Because of this feature, the solid state disk uses "logical sector numbers" or LSNs to associate data with a sector number. This requires an extra level of translation and indexing that exposes the solid state disk to error risks that did not exist in the hard drive. Before discussing error management to account for these risks, an explanation of the features of the solid state disk including the translation and indexing schemes is required.

Solid State Controller

Referring to FIG. 2, reading, writing, and clean-up of flash array 62 is controlled by solid state disk controller 64. Microprocessor 92 manages these tasks using database 93, sector header translation table (SHTT) 94 and algorithms which are stored in flash memory 95.

An application specific integrated circuit, window ASIC 96, serves as a "window" to the outside world for microprocessor 92 as well as windows into flash array 62. Through window ASIC 96, microprocessor 92 receives commands from CPU 52 and reads and writes to flash array 62. Window ASIC 96 includes multiple windows, allowing microprocessor 92 to repeatedly and rapidly access a number of flash memory locations.

Data to and from CPU 52 flows through window ASIC 96 to sector buffer 98. Sector buffer 98 allows data transfers to CPU 52 to occur more rapidly than possible otherwise. In one embodiment, sector buffer 98 is a random access memory (RAM) sector buffer.

Solid state disk controller 64 includes charge pump 100. Charge pump 100 converts, if necessary, the available supply voltage into the voltage level needed for programming and erasure of the flash devices within flash array 62.

Solid state disk controller 64 may include a database on flash array 62 in order to enhance performance. For example, reading, writing, and clean-up operations may benefit from information regarding total number of free and dirty words within flash array 62, the total number of free and dirty words in each block, and the number of free words within each chip pair. In one embodiment, flash array database 93 is stored in RAM.

Flash memory 95 is used to store algorithms for handling reading, writing, clean-up, and error correction for flash array 62.

Block Data Structure for flash Array

The flash devices within flash array 62 must be erased a block at a time, but can be programmed a byte at a time. Once programmed to a 0, a bit of flash memory cannot be programmed to a 1 without first erasing an entire block. Erased bytes of memory are referred to as "free" because they are ready to be written.

Erasure of flash memory is a slow process. Performing an erase each time a sector of data is written is impractical. Writes would be slow and power consumption inefficient because an entire block, e.g., 128 Kbytes, would have to be erased just to write one sector, 512 bytes. To allow rapid sector writes, solid state disk controller 64 writes each sector of data to a new, free location each time a sector is written. A result of this write method is that there may be several versions of the sector data associated with a single sector number. The most recent version of the sector data is referred to as a "good sector," "valid sector" or a "user sector." In contrast, the earlier version of the sector is invalid and will be marked as "dirty."

To permit word-wide input and output, flash array 62 is organized as pairs of flash devices, only one chip pair 66 of which is shown. In this embodiment, each flash chip inputs and outputs data 8 bits at a time. High chip 68 of chip pair 66 stores the high byte of a word, while low chip 70 stores the lower byte of a word. Solid state disk controller 64 is thus able to treat each chip pair as a single 16 bit-wide memory device. Word-wide input and output gives solid state disk 60 a speed advantage compared to hard drives, which use serial bit stream input/output (I/O).

Each chip pair is organized as 16 blocks, such as block 80, each block including 128 Kbytes of memory. Because each block of memory can store many sectors of data, each block includes a block sector translation table (BSTT) 84, as illustrated in FIG. 3, to identify and locate each sector of data.

FIG. 3 illustrates block 80 and the data structure used by it and all other blocks. Block 80 is represented as a single word wide structure but is actually stored in two flash chips. Referring to FIG. 2, the high byte of each word is stored in high chip 68 and the low byte of each word is stored in low chip 70. For example, the high bytes (80*a*) of each word in block 0 are stored in high chip 68 and the low bytes (80*b*) of each word in block 0 are stored in low chip 70.

The data structure of block 80 includes block sector translation table 84 and data space 86. Block sector translation table 84 stores headers. A header is a block of information about one logical sector number and its associated data. As used herein a logical sector number (LSN) refers to a sector number stored within a BSTT. A sector number is a sector identifier received from CPU 52, which the CPU believes corresponds to a fixed physical location. However, as a result of the write policy used by solid state disk 60, an LSN does not correspond to a fixed physical location. Also as a result of the write policy used, several headers and LSNs may correspond to a single sector number. In one embodiment, each logical sector number is 24 bits long.

A header is created for each and every sector number during disk formatting. This allows the loss of sectors of data to be detected during the execution of read and write commands. Failure to find the header associated with a particular sector number indicates that the associated sector of data has been lost. As used herein "lost" refers to a sector of data that disappears because of a defect in flash 62 array or to a sector of data that is unreliable because it has been corrupted.

Each header 85 includes a cyclical redundancy check (CRC) value, which allows solid state disk 60 to determine the reliability of header 85.

Header 85 also includes an attribute word that contains information about the sector data associated with the header. For example, one bit of the attribute word indicates whether the sector number has been marked as part of a bad track. Another bit indicates whether or not the sector data has been compressed. The attribute word also includes two dirty bits for reliability. The sector data associated with the header is considered valid if both dirty bits are set and dirty if either dirty bit is reset. The attribute word includes a data attached bit. When no sector data is attached to the header, the data attached bit is reset. This is the case for all headers after formatting. Once data is written for the sector number, the data attached bit is set. The final piece of information included in the attribute word is a revision number. The revision number allows solid state controller 64 to identify the valid header when multiple valid headers with the same LSN exist.

The last piece of information stored in header 85 is a block sector offset (BSO). The BSO is an offset from the top of the block to the start of flash memory space associated with the header. Memory space is allocated to a header whether or not data is stored in that space. If data is not attached to the header, then the amount of memory allocated is the size of data space 86 divided by the maximum number of headers in BSTT 84.

Because data for one sector is contiguous with data for another sector in data space 86, each BSO indicates the top of data for one sector and the bottom of data for another sector. For example, the block offset for sector 1, $BSO_1$, points to the start of the data associated with $LSN_1$. $BSO_1$ also points to the bottom of data associated with $LSN_2$. Another way of looking at block sector translation table 84 is that each LSN is sandwiched between two block sector offsets, one pointing to the top of the sector data and the other pointing to the bottom of the sector data. The bottom of the data associated with the sector stored at the bottom of the block, $LSN_1$, need not be indicated by a BSO as the location of the bottom of the block is known.

Block sector translation table 84 grows down toward data space 86. The first header BSTT 84 is written at the top of block 80. The header for each succeeding sector written into block 80 is stored below the previous header.

In contrast to BSTT 84, data space 86 grows upward. The first sector of data written into block 80 is written into the bottom of data space 86. The next sector of data written into data space 86 is written immediately above the previous sector. For example, the data associated with $LSN_2$ is located within a lower range of addresses than the data associated with $LSN_1$.

Solid state disk controller 64 prevents BSTT 84 and data space 86 from crashing into each other as they grow. Solid state disk controller 64 ensures that some slack 88 is maintained between BSTT 84 and data space 86. Slack 88 is free flash memory, which has not been programmed. According to the conventions of flash memory, a free memory location stores FFFF (hexadecimal). During seeks of block sector translation table 84, slack 88 indicates that the end of BSTT 84 has been reached.

Block 80 also stores block attribute data 90. Information specific to the block is stored attribute data 90. For example, block attribute data 90 includes cycle count, which indicates the number of times the block has been erased and written to. Block attribute data 90 may also include block defect information.

Sector Header Translation Table

Sector header translation table (SHTT) 94 translates a sector number into a pointer to an associated sector of data. To permit its frequent and easy modification, SHTT 94 is preferably stored in RAM. In one embodiment, the pointer supplied by sector header translation table 94 does not point directly to the data associated with the given sector number. Rather, the pointer supplied by SHTT 94 points to a location within BSTT 84 near the header associated with the sector number.

The reason why SHTT 94 does not point directly to the header associated with the sector number can be understood by examining the number of bits necessary to uniquely address each possible header in a BSTT 84. In this embodiment, a maximum of 2048 headers may be stored in a BSTT 84. Given 15 chip pairs, each including 16 blocks in a chip pair, flash array 62 could store as many as 491,280 headers. Uniquely identifying that many headers requires 19 bits. Storing 19 bits requires using three by 8 RAM chips. Thus, 5 of 8 bits in one RAM would be wasted to store three bits. This is an expensive and unacceptable solution in the effort to produce a price competitive solid state memory disk.

A number of SHTT designs solve this 19 bit dilemma. One embodiment, shown in FIG. 4, stores a pointer for every one of the possible 83,300 sectors numbers of data of an industry standard 40 MB disk drive. Only 16 bits are stored for each entry in SHTT 94. Four of the bits indicate the chip pair in which the sector data being sought is stored. Another four bits indicate the particular block in which the sector is stored. The remaining 8 bits represent an offset from the top of the block to a header which is near the desired header. This offset is called a header pointer. Using 8 bits to represent the header pointer means that there are 256 header pointers available to locate a maximum of 2048 headers. Consequently, a maximum of 8 headers must be scanned in BSTT 84 to locate the desired header. Stated another way, SHTT 94 requires a two tiered search to locate the data associated with a particular sector number. First, SHTT 94 is searched to locate a particular chip, block and header pointer. Second, the indicated area of BSTT 84 is searched to find the header associated with the sector number. The number of headers that have to be searched through is inversely related to the "resolution" of the SHTT header pointers. In other words, if more bits are used to define the header pointers then fewer headers will have to be searched through. The smallest number of headers to search through would be 1 (i.e., the SHTT points directly to the header), however, this would also require the largest number of entries in the SHTT (i.e., one for each header).

Initialization of the Sector Header Translation Table

Both flash array database 93 and SHTT 94 must be generated during power-up because they are stored in volatile memory (RAM), and because reads and writes depend upon database 93 and SHTT 94.

FIG. 5 illustrates an algorithm to build both flash array database 93 and SHTT 94. Using this algorithm both SHTT 94 and the flash array database 93 are generated by scanning each BSTT 84. The location of the header associated with each sector number is noted, as well as the amount of free and dirty memory within the block.

Building begins in step 110 with the initialization of SHTT 94. Each pointer for each sector number is set to the same initial value. In one embodiment, that value is FFFF (hexadecimal). As a result, after building SHTT 94 retrieving a pointer equal to the initial value indicates that the sector of data associated with the sector number has been lost because during formatting a header is created for each sector number. Microprocessor 92 branches from step 110 to step 111.

The total amount of free memory within flash array, TFFA, and the total amount of free memory per chip, $TFFC_M$, are initialized to their maximum values in step 111. The maximum free flash memory per chip is 64 Kbyte/block*16 blocks, or 2048 Kbyte per chip pair minus the block attribute data stored in each block. Similarly, $TFFA_{max}$ is 2048 kilobytes (Kbyte) per chip pair*15 chip pairs, or approximately 30 Mbyte. This done, microprocessor 92 branches to step 112 to begin scanning BSTTs 84.

In step 112 microprocessor 92 determines whether any block within flash array 62 remains to be scanned. If so, microprocessor 92 proceeds to step 114 and selects a block, $B_C$, to scan. From step 114, microprocessor 92 branches to step 115. There the total amount of free memory in the current block, $TFFB_C$, is initialized to its maximum. Microprocessor 92 then proceeds to step 116.

In step 116, microprocessor 92 reads the next header from the selected block's block sector translation table 84. Afterward, microprocessor 92 branches to step 118.

Microprocessor 92 begins to classify the current header in step 118. Microprocessor 92 determines whether the header has been marked dirty by reading the dirty bits included in the attribute word of the current header. If either dirty bit is a logical zero, the data associated with the LSN is considered dirty. If the sector of data is dirty, then microprocessor 92 branches to step 120 to update flash array database 93.

In step 120, microprocessor 92 determines the size of the dirty sector, which may vary as a result of data compression. Sector size is determined by comparing the block sector offsets on either side of the current LSN. After determining the size of the dirty sector, microprocessor 92 updates TDFA and $TDFB_C$. The total number of dirty words, TDFA, and the total number of dirty words within the current block, $TDFB_C$, are increased by the size of the sector and its header. Microprocessor 92 appropriately revises its flash free variables. The size of the current sector and its header are subtracted from TFFA, $TFFB_C$ and $TFFC_C$. Afterwards, microprocessor 92 returns to the building of flash array database 93 and SHTT 94 by branching back to step 116.

On the other hand, if the sector is not dirty microprocessor 92 branches from step 118 to step 122. Microprocessor 92 then examines the attribute word within the current header to determine if the end of the BSTT 84 has been reached. If the attribute word for the next header is FFFF (hexadecimal), the end has been reached. In this case, microprocessor 92 branches back to step 112 to determine whether scanning of BSTTs 84 should continue. In all other cases, microprocessor 92 advances to step 124 from step 122.

Entry into step 124 means that the current header is associated with a valid sector of user data. Accordingly, microprocessor 92 reduces free variables TFFA, $TFFB_C$ and $TFFC_C$ by the size of the current sector. (The subscript "C" designates "current.") This done, microprocessor 92 advances to step 126.

In step 126, revision of the SHTT entry for the current header begins by seeking an entry in SHTT 94 for the sector number equal to the LSN included in the current header. If the current entry in the SHTT is FFFF (hexadecimal), no information exists for the sector number. Microprocessor 92 responds to this situation by branching to step 128. Any entry other than FFFF for the sector number means that there are two versions of the data for that sector number. In the latter case, microprocessor 92 advances to step 130 to determine which version is the most recent.

Consider first the simpler situation; that is, when no data is stored in SHTT 94 for the sector number corresponding to the current LSN. In step 128, microprocessor 92 writes the chip pair, block and header pointer for the current header into SHTT 94. This done, microprocessor 92 branches back to step 116 to examine another header.

Things are more complicated when SHTT 94 already includes an entry for the sector number associated with the current LSN. In step 130, the microprocessor determines which header and thus which sector of data is most current by comparing their revision numbers. In step 132, microprocessor 92 then marks dirty the earlier, invalid, sector of data by programming the dirty bits in its header to a logical 0.

In step 133, the microprocessor updates database 93 to reflect the total number of dirty words for the block including the sector just marked dirty and the total number of dirty words for flash array 62. The update is accomplished by adding the sector size to $TDFB_C$ and TDFA.

SHTT 94 is finally updated, if necessary, in step 134. No update is necessary if the header and LSN selected in step 116 were marked dirty in step 132. Otherwise, the chip pair, block and header pointer for the LSN selected in step 116 are written into SHTT 94.

From step 134, microprocessor 92 returns to step 116. There another header is selected.

After every header within flash array 62 has been scanned (i.e., "NO" in step 112), the building of SHTT 94 is complete. If a header has not been located which corresponds to a sector number, the pointer within SHTT 94 remains at its initial value. Thus, the pointer indicates that the sector of data has been lost and every sector of data is accounted for by SHTT 94.

Algorithmic Control of Solid State Drive

The heart of solid state disk controller 64 is the set of algorithms stored within flash memory 95. These algorithms control the reading, writing, and cleaning-up of flash array 62. These algorithms help create the illusion that CPU 52 is dealing with an industry-standard hard magnetic disk drive.

The object diagram of FIG. 6 illustrates the general organization and interrelationship of algorithms used by solid state controller 64. The algorithms of solid state disk controller 64 are organized into three classes: top level scheduler 150, host interface 152, and flash media 154. Top level scheduler 150 handles the allocation of microprocessor 92 processing time between the other two classes 152 and 154. Host interface 152 interprets industry standard disk drive commands from CPU 52 and translates them into commands that flash media 154 can act upon. Flash media 154 interfaces directly with flash array 62, responding to read and write requests from host interface 152. Flash media 154 also manages the cleaning-up of flash array 62.

The scheduling of host interface 152 and flash media 154 is a relatively simple task. Power-up of solid state disk 60 fires top level scheduler 150. It initializes the solid state disk 60 and then calls host interface 152. This allocates to CPU 52 all the resources of solid state disk 60. When host interface 152 returns control to top level scheduler 150, clean-up object 164 is called. If a clean-up is on-going, then a slice of microprocessor 92 execution time, 500$\mu$ seconds in one embodiment, is allocated for clean-up. When clean-up returns control to top level scheduler 150, host interface 152 is called again. Top level scheduler 150 repeats the process again and again for as long as solid state disk 60 is powered up.

Host interface 152 includes two classes of algorithms, interface 156 and sector buffer manager 158. Interface 156 emulates an Advanced Technology-Integrated Device Electronics (AT-IDE) hard disk interface. Interface 156 handles AT-attachment (ATA) command interrupts and translates ATA commands into commands comprehensible by flash media 154. In alternate embodiments, host interface 156 may simulate a small computer system interface (SCSI) disk interface or other standard disk drive interface. Sector buffer manager 158 manages the usage of sector buffer 98.

Briefly described, flash media 154 includes five types of algorithms, or services: disk 160, sectors 162, clean-up 164, flash power 166 and flash array interface 167. Disk 160 services read and write requests from interface 156. Disk 160 also translates other commands from interface 156 and delegates them for execution to fellow classes 162, 164, 166 and 167. Sectors 162 is responsible for most tasks relating to sectors stored within flash array 62. Sectors 162 maintains flash array database 93 used by both disk 160 and clean-up 164, and allocates free memory space within flash array 62. Sectors 162 also controls the reading of data from flash array 62 via flash array interface 167 and sequencer 168. Flash power 166 is essentially a device driver; that is, it generates the voltage levels necessary to read or write to flash array 62. Flash array interface 167 handles the low level routines which directly control the reading and writing of flash array 62. Sequencer 168 handles the movement of data between sector buffer 98 and flash array 62. Just as its name implies, clean-up 164 manages the clean-up of flash array 62. Flash power 166 manages the limited current budget of solid state disk 60.

Redundant Logical Sector Numbers

With the understanding of one embodiment of a solid state drive, an improvement can now be described. An alternative to the header structure illustrated in FIG. 3 can both 1) help reduce the susceptibility of the solid state drive to certain types of errors, and 2) improve the ability to recover from errors. FIG. 7 illustrates one embodiment of the alternative header structure.

In FIG. 3, the LSN consisted of three bytes. The bytes were distributed among both the high and low chip of a chip pair. In FIG. 7, however, two identical LSNs (710, 720) are stored in the header 785, thus one of the LSNs is a redundant LSN (RLSN). Furthermore, note that the bytes of each LSN are stored in only one of the chips of the chip pair. In other words, all three bytes of the primary LSN 710 are stored in high byte chip 68 and all three bytes of the RLSN or secondary LSN 720 are stored in low byte chip 70. The first LSN will also be referred to as the primary LSN. The RLSN will also be referred to as the secondary LSN.

Note that the primary LSN and the RLSN are not stored in "byte" order in this embodiment. The primary LSN is stored as $LSN_2$, $LSN_1$, and $LSN_3$ when proceeding down the header. The RLSN is stored as $RLSN_1$, $RLSN_3$, and $RLSN_2$ when proceeding down the header. Note however that the first two words of the header include $CRC_1$ (730), $RLSN_1$, $LSN_2$, and $RLSN_3$. Thus a complete logical sector number formed from at least a portion of at least one of the LSN and the RLSN is available from the first two words of the sector header. Similarly, the next two words contain $CRC_2$ (732) and another logical sector number formed from portions of the LSN and the RLSN (i.e., $LSN_1$, $RLSN_2$, $LSN_3$).

This introduces the concept of first and second stored logical sector numbers that are formed from the primary and secondary logical sector numbers. The advantages of using first and second stored logical sector numbers instead of the actual primary and secondary logical sector numbers is further discussed with respect to FIG. 9.

Seeking a Sector of Data without an RLSN

FIG. 8 illustrates a method of seeking sector data given a sector number.

Briefly described, the seek algorithm of FIG. 8 uses a two tiered approach. First, SHTT 94 is searched to locate a chip pair, block, and a header offset for the sector number input, $SN_i$. Then, using that information, a BSTT 84 is searched for a header with an LSN equal to the sector number input by the caller.

The two-tiered search begins with step 806. Microprocessor 92 performs the first level of search by searching SHTT 94 for the chip pair, block, and header pointer associated with the sector number input $SN_i$. The values for the chip pair, block, and header pointer retrieved in step 806 are examined in step 808 to determine whether a header can possibly be located for $SN_i$. If the values are equal to the initial invalid value, then the header associated with $SN_i$ has been lost. In one embodiment the initial, invalid values are FFFF (hexadecimal). Microprocessor 92 responds to invalid chip pair, block, and header pointer values by branching to step 824. There the caller is informed that the header associated with the input sector number was not found. This equates to an "ID not found" message in the ATA command set. From step 824, the method proceeds to return in step 804. On the other hand, if the values retrieved from SHTT 94 are valid, microprocessor 92 advances to step 810.

The second tier of the seek begins in step 810 by initializing a scan count to zero. The scan count tracks the number of headers examined during the seek. Microprocessor 92 then reads the header near the header pointer.

From step 810, microprocessor 92 advances to step 812 to compare the current scan count to the maximum scan count.

The maximum number of headers that must be scanned is set by dividing the maximum number of headers in a BSTT 84 by the maximum number of header pointers. For example, in one embodiment of solid state disk 60, a maximum of 2048 headers are stored in BSTT 84 and only 256 header pointers are used. Thus, a maximum of 8 headers must be scanned in this embodiment. If the scan count is less than the maximum, microprocessor 92 branches to step 814 to continue the search for the desired header. On the other hand, once the scan count equals the maximum, microprocessor 92 advances to step 824 from 812.

Consider first the situation when the scan count is less than the maximum. Microprocessor 92 enters step 814 where it compares the LSN stored in the current header (i.e., $LSN_C$) to the input sector number. There microprocessor 92 determines whether the current header is the one sought by comparing the sector number input, $SN_i$, to the LSN stored in the block. If $LSN_C=SN_i$, microprocessor 92 advances to step 816. If the two are equal, the desired header may have been located. Otherwise, the search for the desired sector must continue.

The search for the desired sector continues in step 822 by incrementing the scan counter. If the maximum scan count has not been reached, microprocessor 92 reads the header located beneath the previously read header. Microprocessor 92 then proceeds to determine whether this new header is the desired header in step 814.

When an LSN is equal to the input sector number, microprocessor 92 advances to step 816 from step 814. In step 816 a cyclical redundancy check, $CRC_G$, is generated for the current header. $CRC_G$ is used in step 818 to assess the reliability of the information included in the header.

In step 818 reliability of the header is determined by comparing $CRC_G$ to the CRC stored in the selected header. The information within the header cannot be relied upon unless the two CRCs are equal.

Microprocessor 92 branches to step 820 from step 818 if the current header is not reliable. In step 820, the block is marked for clean-up. Microprocessor 92 then advances to step 822.

If the current header can be relied upon, microprocessor 92 advances from step 818 to step 800. Having reached step 800, microprocessor 92 begins gathering the information needed to read the sector data. First, the size of the sector is determined by reading the appropriate BSOs. Finally, in step 802 the sector size and attribute word are returned to the caller along with the chip pair, block, and offset to the header. Microprocessor 92 then returns control to the caller in step 804.

Seeking a Sector of Data using an RLSN

FIG. 9 illustrates the modifications to the seek algorithm required to make use of the RLSNs. The iterative portion of the flowchart illustrated in FIG. 8 (i.e., everything to the right of circled symbols A, B, and C) is replaced with the algorithm illustrated in FIG. 9. The A, B, and C in FIG. 9 corresponds to the A, B, and C, respectively, in FIG. 8.

The flowchart of FIG. 9 starts by setting the scan count to zero in step 910. As before, the scan count tracks the number of headers examined during the seek. Microprocessor 92 then reads the header near the header pointer to get a first stored LSN. The term "first stored LSN" is used here to differentiate from the primary LSN.

Referring to FIG. 7, in order to get a complete one of either the primary LSN or the RLSN, at least three fetches are required because each is distributed across three distinct words. In order to get both, four fetches are required. However, by examining the order, one can see that $RLSN_1$, $LSN_2$, and $RLSN_3$ are in that order in the first two words. Thus a complete, stored, logical sector number is available in only two fetches. This first stored logical sector number, however, is made from a portion of each of the primary LSN and the RLSN. The use of a "first stored logical sector number" may help the performance of the solid state drive because only two fetches are required to obtain a logical sector number. Furthermore, this technique permits the solid state drive to be backwards compatible in the sense that the use of the method shown in FIG. 8 (i.e., without RLSNs) will still work on the solid state drive.

From step 910, microprocessor 92 advances to step 912 to compare the current scan count to the maximum scan count. If the scan count is less than the maximum scan count, microprocessor 92 branches to step 914 to continue the search for the desired header. The search of the first stored LSN is essentially the same as the technique used without an RLSN. Thus, steps 914, 916, 918, 920, and 922 are the same in FIG. 9 as they were in FIG. 8 except that the first stored logical sector number is used. Once the scan count equals the maximum, however, microprocessor 92 advances to step 950 from 912 instead of stopping and returning header not found. In steps 950–962 the second stored logical sector number is used to properly identify the header.

First, the scan count is initialized to zero at step 950. From step 950, microprocessor 92 advances to step 952 to compare the current scan count to the maximum scan count. If the scan count is less than the maximum scan count, microprocessor branches to step 954 to continue the search for the desired header. This time, however, once the scan count equals the maximum, microprocessor 92 advances back to step 824 (FIG. 8).

If the scan count is less than the maximum, microprocessor 92 enters step 954 where it compares the second stored logical sector number that is stored in the current header to the input sector number. There microprocessor 92 determines whether the current header is the one sought by comparing the sector number input, $SN_i$, to the second stored logical sector number stored in the block. If the second stored logical sector number=$SN_i$, then microprocessor 92 advances to step 956. If the two are equal the desired header may have been located. Otherwise, the search for the desired sector must continue.

The search of the desired sector continues in step 962 by incrementing the scan counter and reading another header located beneath the last header. Microprocessor 92 then returns to step 954 to determine whether this new header is the desired header.

When a second stored logical sector number is equal to the input sector number, microprocessor 92 advances to step 956 from step 954. In step 956 a cyclical redundancy check, $CRC_G$, is generated for the current header. $CRC_G$ is used in step 958 to assess the reliability of the information included in the header.

In step 958 reliability of the second stored LSN is determined by comparing $CRC_G$ to the $CRC_2$ stored in the selected header. Microprocessor 92 branches to step 824 (FIG. 8) from step 958 if the two CRCs are not equal. On the other hand, even if they are equal, microprocessor 92 first marks the block for clean-up in step 960. Even though the sector information was found, there is a problem with the first stored LSN which may be indicative of potential problems with the sector data itself (e.g., charge loss problems). Microprocessor 92 then advances to step 800 (FIG. 8) from 960. Microprocessor 92 then proceeds from step 800 as before until control is returned to the caller in step 804.

Alternative Embodiment of Seek Algorithm Using RLSNs

FIG. 10 illustrates an alternative embodiment of the seek algorithm of FIG. 9. FIG. 10 is very similar to FIG. 9. Instead of a direct comparison with the second stored LSN, however, a value is determined by performing a logical AND operation between the first and second stored LSNs. This is evident by comparing step 1054 of FIG. 10 with step 954 of FIG. 9. This ANDed value is also used to generate $CRC_G$ in step 1056.

The verification of this ANDed value requires that $CRC_1$ and $CRC_2$ be anded before comparing the result to $CRC_G$. The "•" in step 1058 is intended to indicate the boolean logic operator "AND".

Reading a Sector of Data from flash Array 62

Briefly described, reading a sector is a three step process. First, SHTT 94 is searched for a pointer to the header associated with the sector number. Second, the header is located and its attribute word is examined to see if the attached data is valid. Third, if the sector data associated with the header is valid, its location is determined and the sector data is provided to sector buffer 98 where CPU 52 can access it through the host interface.

A read algorithm is illustrated in the flowchart of FIG. 11. This is a read algorithm before the introduction of RLSNs such as one that might be used in conjunction with the data structure of FIG. 3. All callers input a sector number.

The first task of microprocessor 92 in step 1180 is examination of the input sector number for validity. The maximum number of sectors within an industry standard disk drive determines whether a sector number is valid. For example, a standard 40 MB drive includes 83,300 sectors. Thus, any sector number greater than 83,300 would be invalid in a 40 MB drive.

Microprocessor 92 branches from step 1180 to step 1188 if the calling program provided an invalid sector number. Microprocessor 92 indicates the invalidity of the sector number to the caller by setting a status word to indicate an invalid sector number range. Microprocessor 92 then branches to step 1190, returning control to the caller.

On the other hand, microprocessor 92 proceeds to step 1182 from step 1180 if the caller has provided a valid sector number. In step 1182 microprocessor 92 takes the sector number and searches SHTT 94 for the chip, block and header pointer associated with the sector number.

Microprocessor 92 determines in step 1184 whether a header exists for the sector number requested. Microprocessor 92 may be able to tell whether a header exists for a particular sector number by examining the header pointer retrieved from SHTT 94. If the header pointer is FFFF (hexadecimal), a valid header cannot be found for the sector number, even though a header is created for every sector number during formatting.

Microprocessor 92 responds to a lost sector by branching to step 1186 from step 1184. There microprocessor 92 indicates that the header was not found. Microprocessor 92 then branches to step 1190, the read complete.

If in step 1184 a header exists for the sector number then microprocessor 92 branches to step 1110 from step 1184.

The scanning process in steps 1110–1122 is identical to that described above with respect to steps 810–822 of FIG. 8 ("seek" operation). The processes differ however, after the CRC check. Instead of returning the sector information (i.e., size, location, etc.) as shown in FIG. 8, the read operation branches from a successful CRC check to initiate the read sequencer.

If the CRC check in step 1118 indicates that the LSN is valid then microprocessor 92 proceeds to step 1192. At step 1192, the read sequencer is initiated so that the sector data will be copied from the flash array to the sector buffer 98. The host CPU will have access to the sector data in the sector buffer through the host interface. After initiating the read sequencer microprocessor returns to the caller by branching to step 1190.

Reading a Sector of Data using an RLSN: Validation

While sector data is being copied from flash array 62 to sector buffer 98, microprocessor 92 can execute other tasks while servicing host CPU 52 without impacting solid state drive performance.

One enhancement to the read process in FIG. 11 would be to perform CRC checking while the read sequencer is handling copying of the data from the flash array to sector buffer 98. Eliminating the CRC check up front reduces the time required to respond to the read request from the host CPU. FIG. 12 illustrates the process including using the first stored LSN from the primary and secondary LSNs.

In comparison with FIG. 11, FIG. 12 has eliminated steps 1116, 1118, and 1120. Instead of performing the CRC check up front, once a match is found (i.e., step 1214) microprocessor branches to step 1292 to initiate the read sequencer.

While sector data is being copied into the sector buffer for the host CPU validation is performed on the header information. Thus while the read sequencer is processing, validation begins at step 1230 by generating the CRC for the current header.

The generated CRC is compared with $CRC_1$ at step 1232. In this flowchart, $CRC_1$ is used for the comparison. Alternatively, however, $CRC_2$ could be used for the comparison. If there is a match then the procedure returns to the caller at step 1290.

If however, there is not a match, then the generated CRC is compared with a value determined by ANDing $CRC_1$ and $CRC_2$ in step 1234. If this generates a successful match then the block is marked for clean-up at step 1238 before returning to the caller at step 1290.

If there is not a match in step 1234 then an error signal is sent to the host CPU at step 1236 because an invalid sector was read. After signaling the host, the block is marked for clean-up at step 1238 before returning to the caller at step 1290.

The additional CRC checking at step 1234 is performed based on an optimistic view of the system. The sector was originally located by looking at the SHTT which directed the request to a group of headers of which one was expected to correspond to the requested sector. When the presumably valid sector was located where the tables indicated that it would be located, the optimistic presumption is that the header is valid. Thus rather than immediately sending an error if the CRC does not match, the flow diagram of FIG. 12 assumes that the header is probably right even though it failed the first CRC check in step 1232.

If the maximum scan count is reached at step 1212, then the search for the header continues as illustrated in FIG. 13 rather than terminating by returning header not found (step 1286) as was the case with FIG. 11 (step 1186). The encircled A, B, and C in FIG. 12 match up with the encircled A, B, and C illustrated in FIG. 13.

In FIG. 13, steps 1310–1392 are identical to those shown in steps 1210–1292 of FIG. 12 with a few exceptions. In FIG. 13 step 1314, note that the second stored LSN is used for comparison rather than the primary stored LSN as illustrated at step 1214 of FIG. 12. In addition, step 1312 now branches to step 1286 of FIG. 12 if the maximum scan count is reached.

Again, this is based on an optimistic view that the sector is most likely where the SHTT indicated that it was.

FIG. 14 is almost identical to FIG. 13 except for step 1414 where the ANDed value of the first and second stored LSNs is compared to the input sector number to determine a match.

As with FIG. 13, if the match is successful then the read sequencer is initiated at step 1492 before branching back to perform CRC validation at step 1230 of FIG. 12.

Detecting and Correcting LSNs during a Clean-up Operation

One of the disadvantages of flash memory is that although it can be written a cell at a time, it can only be erased a block at a time. As noted previously, this means that "changes" are discouraged because they require moving around relatively large blocks of information even though the changes themselves may affect very few cells within the block. Thus "correcting" an LSN may be less efficient than using redundant LSNs.

The clean-up operation provides an exception and an opportunity to correct LSNs on the fly. The clean-up operation is already copying and writing information to new locations (i.e., "target" blocks). If the clean-up operation can detect errors while "cleaning-up" a block, then at that time the clean-up operation can write the corrected value, instead of the copied value, to the target block. In addition, certain clean-up operational tasks such as allocating free memory require a relatively substantial amount of time. This "time" may provide an opportunity to perform some error correction without impacting the performance of the solid state drive.

The use of RLSNs during a background clean-up operation will be discussed. The technique applied during a background clean-up is similarly applicable in other clean-up modes.

Background Clean-up Operation

FIG. 15 gives an overview of clean-up by illustrating each state of a clean-up state machine. Each step in FIG. 15 represents one state, or algorithm, of a clean-up state machine. The arrows between states represent the next state pointed to by a clean-up state machine (CSM) next state pointer at the end of a state.

Background clean-up begins in state 380 by evaluating whether clean-up is necessary. Evaluation of whether clean-up is necessary is skipped during foreground clean-up and forced clean-up. If clean-up is not necessary microprocessor 92 branches down to state 396 after setting the CSM to idle. This returns control of microprocessor 92 to top level scheduler 150. On the other hand, if clean-up is deemed necessary, a number of blocks will be cleaned up. The selected number of blocks is indicated by a counter. Afterward, microprocessor 92 is pointed to state 382 by the CSM next state pointer.

Clean-up begins in earnest in state 382 by selecting a focus block to clean-up. The next state pointer then points microprocessor 92 to state 383.

Prior to erasing the focus block, valid sectors of user data must be safely relocated. This task requires branching through states 383, 384, 385, 386, and 388 repeatedly until each and every sector of user data within the focus block has been safely copied into new locations. Relocation of user data begins in state 384 by locating and allocating a new physical location for one good sector of user data. The block selected as the new location is referred to as a destination or target block. According to this terminology, clean-up has one focus block but may have many destination blocks. Microprocessor 92 is then pointed to state 385 by the CSM next state pointer.

Copying a sector from the focus block into a destination block is a two step process. The selected sector of valid user data is first copied from the focus block into sector buffer 98. Secondly, the valid sector is copied from sector buffer 98 into the destination block. This two step process is not necessary, but it improves the reliability of user data by taking advantage of the error detection capabilities of an error detection circuit that is in the path of sequencer 168.

In state 385, the sector is copied from the focus block into sector buffer 98.

In state 386 microprocessor 92 copies part of a valid sector from the sector buffer to the current destination block. Only a part of the valid sector is copied at one time given write speeds and the desire to keep background clean-up from impacting response to read and write commands from CPU 52. Thus, microprocessor 92 may pass though state 386 several times before a valid sector is completely copied into destination block. Once the valid sector has been completely copied, the CSM next state pointer directs microprocessor 92 to state 388.

During state 388 microprocessor 92 performs a postcopy database update by updating sector header translation table 94 so that it points to the new location of the sector just copied from the focus block if the previous version of the data for the sector number was not marked dirty. Otherwise, microprocessor 92 marks the version of the sector it has just copied as dirty. Finally, microprocessor 92 finishes writing the header associated with the new version of the sector data for the sector number. Microprocessor 92 then returns to state 383.

Upon re-entry to state 383, microprocessor 92 determines whether every good sector within the focus block has been relocated. If not, another good sector will be selected for relocation, and microprocessor 92 will branch through states 384, 385, 386, 388 and 383 until every good sector within the focus block has been relocated. When that occurs, the CSM next state pointer directs microprocessor 92 to state 390.

Microprocessor 92 begins erasure of the focus block in state 390. Microprocessor 92 initiates erasure by giving an erase command to the chip pair and indicating the block to be erased. This done, microprocessor 92 proceeds to state 392 to wait for the completion of erasure. The CSM remains in state 392 until the chip pair including the focus block indicates completion of erasure.

The focus block erased, microprocessor 92 performs a posterase database update by updating and copying block attribute data 90 back into the focus block. This done microprocessor 92 is redirected to state 380 by the CSM next state pointer.

Upon reentry to state 380, microprocessor 92 examines the block counter to determine if another focus block should be selected. If so, microprocessor 92 will branch through states 382, 383, 384, 385, 386, 388, 390, 392, and 394 as described. Otherwise, microprocessor 92 branches to step 396, clean-up complete after the CSM is set to idle.

Clean-up Operation using RLSNs

FIG. 16 illustrates a flowchart for correcting LSNs during a clean-up operation starting at step 1610. At step 1612, the first and second stored LSNs are retrieved for the sector currently being copied. At step 1614 the first and second stored LSNs are compared. If there is a match, then the routine branches to step 1616 to perform CRC validation.

A CRC is generated ($CRC_G$) for the current header in step 1616. If the generated CRC matches the stored CRC in step 1618 (i.e., $CRC_G = CRC_1$), then the header information is assumed to be correct and the procedure returns by branching to 1624.

Alternatively, if the generated CRC and the stored CRC do not match (i.e., $CRC_G \neq CRC_1$), then validation proceeds to step 1620 to compare the generated CRC with a value determined by ANDing $CRC_1$ with $CRC_2$.

If the generated CRC matches $CRC_1 \bullet CRC_2$ (where "•" indicates the AND operation), then $CRC_1$ and $CRC_2$ are each replaced with this ANDed CRC value in step 1622 before returning in step 1624.

If however, the generated CRC does not match the ANDed CRC value in step 1622, then the header is marked invalid at step 1634 before returning in step 1624.

If the first stored LSN did not match the second stored LSN in step 1614 then validation proceeds to step 1626 where an ANDed value is calculated from the first and second stored LSNs.

From step 1626, the procedure branches to step 1628 to generate a CRC for this ANDed first and second stored LSN value before proceeding to step 1630.

At step 1630, the generated CRC is compared with an ANDed value determined from $CRC_1 \bullet CRC_2$. The "•" indicates the boolean bitwise AND operation as before.

As in step 1620, if there is no match in step 1630 then the header is marked invalid at step 1634 before returning in step 1624.

Alternatively, if there is a match in step 1630, then there is a branch to step 1632.

In step 1632, the first and second stored LSNs are replaced using the ANDed value of the first and second stored LSNs. In addition, CRC1 and CRC2 are replaced with the value determined by ANDed $CRC_1$ and $CRC_2$.

Column Shorts

The techniques presented above help to recover from errors due to charge losses in the flash array. Semiconductor memories, however, also suffer from column shorts. Column shorts occur when adjacent bitlines are electrically shorted together. This might occur unintentionally, for example, during the manufacturing process. This can have a disastrous effect on high density memories (e.g., multiple bits per memory cell) or memories using relatively long bitlines. The column short tends to render useless all the cells associated with each shorted bitline. Thus, for example, all cells associated with two shorted columns (i.e., a "dual column short") in at least an entire block will be affected.

Error management can be divided generally into 1) detecting the occurrence of errors; and 2) correcting the errors. In computer systems, an error detection circuit (EDC) is used to help determine whether an error occurred. Thus an EDC can be used, for example to determine whether an entire sector was successfully read.

An error correction code (ECC) may be used by the EDC both to help detect and to help repair the error once it is detected. The ECC is limited in that it can only correct up to a threshold number of errors. Thus once a certain number of errors has occurred within the sector, the ECC may not be useful for resolving or even detecting them.

Locating the data that has a high probability of being in error can greatly increase the error management capabilities in a binary storage system. Therefore locating column shorts can greatly aid the process of reconstructing data.

In a flash memory, any attempted read or sensing of a cell that is part of a column short will return a "1". In other words, regardless of the value stored in such a cell a "1" will always be returned. Thus if there are errors for a memory that has a column short, the cells associated with the short have a relatively high probability of being in error.

FIG. 7 illustrates another addition to the block information which helps to detect and locate column shorts. In particular, a column short (or CS) data stripe 740 is written to the block. The CS stripe consists of a known value of all zeroes. Thus if a column short is detected, the data stripe serves to both detect and locate bit positions subject to CS errors.

Because a CS error will return a "1" no matter what value is stored in a cell, any "1" that appears when reading the CS data stripe both detects and locates the bit positions which are affected by CS errors. In other words, because a known "0" value has been written to every bit position in the CS stripe then any bit position that reads back as a "1" indicates the position of a bit affected, for example, by a column short. In FIG. 7, the CS data stripe 740 or CS word is illustrated at the bottom of the flash block, however, in alternative embodiments the CS word may be located in other positions such as at the top of the flash block.

Sometimes the data needs to be accessible even though it appears to be in error. Even if the data is in error, there may be more sophisticated data reconstruction tools available to the host CPU than what is available within the solid state drive. In such cases, the data should be accessible, but noted that it failed error correction routines. A single bit within the header could be used to identify such a sector of data. FIG. 7 illustrates one embodiment of the location of an ECC long bit 790. Long bit 790 is provided so that sector data can be retrieved even though the sector data may be in error. Long bit 790 is used to indicate invalid sector data, however, a user can access the data if necessary.

FIG. 17 illustrates a flowchart for error management using the CS data stripe in conjunction with error detection and correction hardware or software.

First, sector data is read into the sector buffer using EDC. If no sector data error is detected in step 1712, then the process terminates by branching to step 1790.

If a sector data failure is detected, then in step 1714 an attempt is made to correct the error using the ECC. If this effort is successful, the process branches to step 1780 to signal ECC corrected to the host before terminating at step 1790.

If, on the other hand, the effort is unsuccessful the sector buffer pointers are reset at step 1716 so that invalid data is not read from the sector buffer. Next, the column short data is read from the flash block in step 1718.

In step 1720, a determination is made whether a CS error occurred by examining the CS data stripe for "1"s. If there are no "1"s, then the error is assumed to be due to other causes. In this case, the process branches to step 1770 to mark the long bit in the header. Then in step 1772 an ECC failure is sent or signaled to the host before the process terminates at step 1790. The long bit will indicate that the data is available but likely in error.

If a CS error is detected in step 1720, then in step 1722 the CS data stripe that was read back is used as a mask to store zeroes in the erasure bit positions of the sector data. The "erasure bit positions" are those affected by the column short.

From step 1722, the masked sector data is again read into the sector buffer using EDC in step 1730. Proceeding to step 1732, if an error is not detected in step 1782, the process signals the host with ECC corrected in step 1782 before finishing by branching to step 1790. If however, an error is detected the next step is to attempt a correction using ECC.

In step 1734, a test is performed to determine whether the correction attempt was successful. If so, the process proceeds to signal or return ECC corrected to the host at step 1780 before finishing in step 1790.

If the ECC was unsuccessful as determined in step 1734, then the sector buffer pointers are reset in step 1736. In step 1742, the CS data is used to mask "1"s into the erasure bit positions of the sector data this time. Proceeding to step 1750, the masked sector data is read into the sector buffer using EDC.

If a sector data error is not detected in step 1752, the process signals the host with ECC corrected in step 1782 before finishing by branching to step 1790. Alternatively, if a sector data error occurred, then an attempt is made to correct the error using ECC.

If, in step 1754, the error could be corrected then ECC corrected is returned or signaled to the host in step 1780 before finishing at step 1790.

If the error could not be corrected using ECC in step 1754, then processing proceeds to reset the sector buffer pointers in step 1756. Next the long bit is marked in step 1770 to indicate that the data is available, but likely in error. After marking the long bit, an ECC failure is returned to the host in step 1772 before finishing at step 1790.

In summary, if a CS error is sufficient to cause a sector data failure then first try storing a first value in all the sector data locations associated with the CS. If this fails, then attempt to store a second value in the sector data locations associated with the CS. Only two values are required in a binary number system, thus the second value is an inverted first value. Because of the knowledge of where the high probability error locations are and the fact that the bit could be one of only two values, this technique might greatly improve the probability of reducing the total number of errors and thus may improve the probability of achieving an error rate below which the ECC may be able to correct.

Multi-level cell flash arrays

Although storing more bits of data per cell permits a greater storage density, the potential data loss is also increased. In other words, the failure of a portion of memory using a higher data density results in a correspondingly higher data loss.

Multi-level cell flash arrays achieve a greater data density because each cell can store more than one bit of information. Multi-level cell flash arrays, however, tend to be more susceptible to charge loss than are single-level cell flash arrays. Thus the techniques presented above may be even more particularly suited for solid state disks using multi-level cell flash arrays.

Implementation

The techniques presented above have been discussed primarily in the context of flash memory based solid state drives. The use of redundancy, however, helps to improve the robustness of any drive system that uses logical identifiers rather than physical locations for sector data. Similarly, other types of memories suffer from column shorts, so the techniques discussed above with respect to column shorts are likewise applicable to other types of memories.

The techniques presented above can be combined or chained together to further enhance the performance of the solid state drive with respect to error management. The use of redundant logical sector numbers and column short data helps to manage errors due to charge loss and errors due to column shorts.

Furthermore, although the techniques above have been presented with respect to "sectors" of data and "sector numbers", these terms are intended only to represent specific embodiments and are not intended to limit the application of the invention. In particular, "sectors" could be replaced with blocks, pages, banks, allocation units, partitions, etc. of memory. The term "sector number" might more appropriately be termed "identifier".

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising the steps of:
   a) partitioning a memory into a plurality of partitions;
   b) storing in the memory a primary logical identifier to identify each partition;
   c) storing in the memory a secondary logical identifier, wherein the secondary logical identifier comprises redundant information for the primary logical identifier;
   d) receiving a requested partition number identifying a partition to access;
   e) locating at least one partition of data stored in the memory using a first stored logical identifier formed from a portion of each of the primary and secondary logical identifiers; and
   f) identifying the at least one partition of data using a second stored logical identifier formed from a portion of at least one of the primary and secondary logical identifiers.

2. The method of claim 1 wherein step e) further includes the step of validating the first stored logical identifier.

3. The method of claim 1 wherein step f) further comprises the step of:
   validating the second stored logical identifier.

4. The method of claim 1 wherein the memory comprises a plurality of memory arrays, wherein the primary logical identifier is stored in one of the plurality of memory arrays, wherein the secondary logical identifier is stored in another one of the plurality of memory arrays.

5. The method of claim 1 wherein step f) further comprises the steps of:
   computing a value determined by performing a logical AND operation between the first stored logical identifier and the second stored logical identifier; and
   comparing the requested partition number with the value.

6. The method of claim 5 further comprising the step of:
   validating the value if the requested partition number matches the value.

7. The method of claim 1 wherein each partition of the plurality of partitions represents a sector of data.

8. The method of claim 7 wherein the primary and secondary logical identifiers correspond to logical sector numbers.

9. The method of claim 1 wherein each partition of the plurality of partitions represents a block of data.

10. The method of claim 9 wherein the primary and secondary logical identifiers correspond to logical block numbers.

11. The method of claim 1 wherein each partition of the plurality of partitions represents a page of data.

12. The method of claim 11 wherein the primary and secondary logical identifiers correspond to logical page numbers.

13. The method of claim 1 wherein the memory comprises flash electrically erasable programmable read only memory.

14. The method of claim 13 wherein the second stored logical identifier is the secondary logical identifier.

15. The method of claim 14 wherein the second stored logical identifier comprises at least a portion of both of the primary and secondary logical identifiers.

16. A method for seeking a requested partition in a memory, comprising the steps of:
   a) receiving a requested partition number from a requesting host, the memory partitioned into a plurality of partitions, each partition identified by a primary logical identifier stored in the memory, each partition identified by a secondary logical identifier, wherein the secondary logical identifier comprises redundant information for the primary logical identifier;
   b) locating at least one partition of data stored in the memory using a first stored logical identifier, wherein the first stored logical identifier is formed from at least a portion of a first combination of the primary and secondary logical identifiers;
   c) testing the validity of the first stored logical identifier;
   d) performing the following steps if the first stored logical identifier is invalid:
      1) locating at least another partition of data stored in the memory from a computed value using a second stored logical identifier, wherein the second stored logical identifier is formed from at least a portion of a second combination of the primary and secondary logical identifiers; and
      2) testing the validity of the computed value.

17. The method of claim 16, wherein step d1) further comprises the steps of:
   (i) computing the value by performing a logical AND operation between the primary logical identifier and the secondary logical identifier; and
   (ii) comparing the value with the requested partition number.

18. The method of claim 16, wherein the computed value is the second stored logical identifier.

19. The method of claim 16 wherein each partition of the plurality of partitions represents a sector of data.

20. The method of claim 19 wherein the primary and secondary logical identifiers correspond to logical sector numbers.

21. The method of claim 16 wherein each partition of the plurality of partitions represents a block of data.

22. The method of claim 21 wherein the primary and secondary logical identifiers correspond to logical block numbers.

23. The method of claim 16 wherein each partition of the plurality of partitions represents a page of data.

24. The method of claim 23 wherein the primary and secondary logical identifiers correspond to logical page numbers.

25. The method of claim 16 wherein the memory comprises flash electrically erasable programmable read only memory.

26. The method of claim 25 wherein the first stored logical identifier is the primary logical identifier.

27. The method of claim 26 wherein the first stored logical identifier comprises at least a portion of both of the primary and secondary logical identifiers.

28. A method of reading sectors from a memory, comprising the steps of:
   a) receiving a requested sector number for the memory from a requesting host, the memory partitioned into a plurality of sectors, each sector identified by a header having a primary and a secondary logical sector number, and a first and a second error detection code;
   b) searching the headers to find a header having a first stored logical sector number matching the requested sector number, each of the first stored logical sector numbers formed from at least a portion of a first combination of the primary and secondary logical sector numbers from the found header;
   c) initiating a read sequencer to read the partition data associated with the found header into a buffer for the requesting host;
   d) generating a first value from the found header;
   e) validating the first value using the first error detection code;
   f) if the first value is invalid, then performing the steps of:
      1) validating the first value against a second value computed by ANDing the first and second error detection codes.

29. The method of claim 28 wherein at least one of the first and second error detection codes for each header is a cyclic redundancy check value.

30. The method of claim 28 wherein the memory comprises a plurality of memory arrays, wherein each primary logical sector number is stored in one of the plurality of memory arrays, wherein each secondary logical sector number is stored in another one of the plurality of memory arrays.

31. The method of claim 28 wherein the memory comprises flash electrically erasable programmable read only memory.

32. The method of claim 28 wherein the first stored logical sector number in each header is the primary logical sector number in that header.

33. The method of claim 28 wherein the first stored logical number in each header comprises at least a portion of both of the primary and secondary logical sector numbers for that header.

34. The method of claim 28 further comprising the following step between steps b) and c):
   g) searching a plurality of second stored logical sector numbers for a found header having a second stored logical sector number matching the requested sector number, each of the plurality of second stored logical sector numbers formed from at least a portion of a second combination of the primary and secondary logical sector numbers in the same header.

35. The method of claim 34 further comprising the following step between steps b) and c):
   g) searching the plurality of headers for a found header, wherein an ANDed value of the first and second stored logical sector numbers of the found header matches the requested sector number, wherein the second stored logical sector number for each header is formed from at least a portion of a second combination of the primary and secondary logical sector numbers in the same header.

36. The method of claim 28 wherein each sector of the plurality of sectors represents a block of data.

37. The method of claim 36 wherein the primary and secondary logical sector numbers correspond to logical block numbers.

38. The method of claim 28 wherein each sector of the plurality of sectors represents a page of data.

39. The method of claim 38 wherein the primary and secondary logical sector numbers correspond to logical page numbers.

40. A method of validating partition data during a clean-up operation on a memory, comprising the steps of:
   a) locating a block of the memory targeted for clean-up, the memory partitioned into a plurality of blocks, each block partitioned into a plurality of partitions, each partition identified by a header in the block, each header having a primary logical identifier, a secondary logical identifier, a first error detection code (EDC), and a second EDC;
   b) selecting a selected header from the block;
   c) comparing a first stored logical identifier of the selected header with a second stored logical identifier of the selected header, the first stored logical identifier formed from at least a portion of at least one of the primary and secondary logical identifiers of the selected header, the first stored logical identifier formed from at least a portion of at least one of the primary and secondary logical identifiers of the selected header;
   d) validating the selected header if there is a match in step c); and
   e) validating an ANDed value of the first and second stored logical identifiers of the selected header, if there is not a match in step c).

41. The method claim 40 wherein step d) further comprises the steps of:
   1) validating the selected header using the first EDC of the selected header; and
   2) validating the selected header using an ANDed value of the first and second EDCs of the selected header, if the selected header is determined to be invalid in step d1).

* * * * *